United States Patent
Lee et al.

(10) Patent No.: US 10,361,248 B2
(45) Date of Patent: Jul. 23, 2019

(54) LIGHT SOURCE MODULE, DISPLAY PANEL AND DISPLAY APPARATUS HAVING BLUE SUB-PIXEL THAT EMITS BLUE LIGHT AND GREEN LIGHT AND METHODS FOR MANUFACTURING THE SAME

(71) Applicant: Samsung Electronics Co., Ltd., Suwon-si (KR)

(72) Inventors: Jin Sub Lee, Suwon-si (KR); Han Kyu Seong, Suwon-si (KR); Yong Il Kim, Seoul (KR); Jung Sub Kim, Hwaseong-si (KR); Seul Gee Lee, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/352,933

(22) Filed: Nov. 16, 2016

(65) Prior Publication Data

US 2017/0236866 A1      Aug. 17, 2017

(30) Foreign Application Priority Data

Feb. 12, 2016   (KR) .................. 10-2016-0016055

(51) Int. Cl.
*H01L 25/16*        (2006.01)
*H01L 27/15*        (2006.01)
(Continued)

(52) U.S. Cl.
CPC .......... *H01L 27/156* (2013.01); *H01L 27/153* (2013.01); *H01L 33/505* (2013.01);
(Continued)

(58) Field of Classification Search
CPC ... H01L 27/156; H01L 33/502; H01L 33/505; H01L 2933/0041; H01L 33/504;
(Continued)

(56) References Cited

U.S. PATENT DOCUMENTS 6,372,608 B1    4/2002  Shimoda et al.
6,645,830 B2   11/2003  Shimoda et al.
(Continued)

FOREIGN PATENT DOCUMENTS

DE    102016109616 A1    12/2016
JP     2015-115241        6/2015
(Continued)

OTHER PUBLICATIONS

Office Action from the German Patent and Trademark Office dated Feb. 5, 2019 in corresponding application DE102017100918.3.

*Primary Examiner* — Mohsen Ahmadi
*Assistant Examiner* — Scott E Bauman
(74) *Attorney, Agent, or Firm* — Muir Patent Law, PLLC

(57) ABSTRACT

A pixel of a light emitting diode module, display panel or other device, may comprise different colored sub-pixels, where one of the sub-pixels comprises a wavelength converting material, such as phosphor, to convert light emitted from an associated light emitting diode of that sub-pixel into a color other than the main color of light emitted from that sub-pixel. The wavelength converting material may have an amount selected to tune the color coordinates of the pixel. The amount of wavelength converting material may be determined in response to measuring the intensity of the spectrum of light emitted by the light emitting diode of the sub-pixel, or similarly manufactured sub-pixels, on which the wavelength converting material is to be formed. Methods of manufacturing the same are also disclosed.

21 Claims, 24 Drawing Sheets

(51) Int. Cl.
*H01L 33/00* (2010.01)
*H01L 33/44* (2010.01)
*H01L 33/50* (2010.01)
*H05B 33/08* (2006.01)
*H05B 37/02* (2006.01)
*H01L 25/075* (2006.01)

(52) U.S. Cl.
CPC ........ *H05B 33/086* (2013.01); *H01L 25/0753* (2013.01); *H01L 25/167* (2013.01); *H01L 33/0095* (2013.01); *H01L 33/44* (2013.01); *H01L 33/502* (2013.01); *H01L 33/504* (2013.01); *H01L 2933/0041* (2013.01); *H05B 33/0845* (2013.01); *H05B 37/0272* (2013.01)

(58) Field of Classification Search
CPC ..... H01L 33/508; H01L 27/153; H01L 33/44; H01L 33/0095; H01L 25/167; H01L 25/0753; H05B 33/0845; H05B 37/0272; H05B 33/086
USPC .......................................................... 257/89
See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,207,691 B2 | 4/2007 | Lee et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,835,953 B2 | 9/2014 | Liu et al. |
| 8,841,831 B2 | 9/2014 | Takei |
| 9,041,277 B2 | 5/2015 | Toda et al. |
| 2007/0170840 A1 | 7/2007 | Chang-Hae et al. |
| 2007/0182887 A1* | 8/2007 | Haga ................ G02F 1/133603 349/106 |
| 2009/0160330 A1* | 6/2009 | Hsu ........................ F21K 9/00 313/506 |
| 2009/0207111 A1* | 8/2009 | Wang ...................... G09F 9/33 345/83 |
| 2010/0001299 A1* | 1/2010 | Chang ...................... F21K 9/00 257/89 |
| 2011/0241044 A1* | 10/2011 | Jang ................ G02F 1/133603 257/98 |
| 2012/0087108 A1* | 4/2012 | Ke ...................... H01L 25/0753 362/97.1 |
| 2012/0175588 A1* | 7/2012 | Qiao ...................... C09K 11/883 257/13 |
| 2014/0055982 A1* | 2/2014 | Tao .......................... F21V 9/16 362/84 |
| 2014/0246990 A1 | 9/2014 | Kim et al. |
| 2015/0022998 A1* | 1/2015 | Tao .......................... F21V 9/16 362/84 |
| 2015/0175881 A1* | 6/2015 | Hirosaki ................ H01L 33/502 313/486 |
| 2015/0327344 A1* | 11/2015 | Ishizuka ............ H05B 33/0845 315/294 |
| 2016/0351764 A1 | 12/2016 | Cha et al. |

FOREIGN PATENT DOCUMENTS

| | | | |
|---|---|---|---|
| JP | 2015-115506 | | 6/2015 |
| JP | 2015-194636 | | 11/2015 |
| KR | 20130055361 A | * | 5/2013 |
| KR | 10-2013-0072997 | | 7/2013 |
| KR | 10-2014-0045655 | | 4/2014 |
| KR | 10-2014-0055823 | | 5/2014 |

* cited by examiner

LIGHT SOURCE MODULE, DISPLAY PANEL AND DISPLAY APPARATUS HAVING BLUE SUB-PIXEL THAT EMITS BLUE LIGHT AND GREEN LIGHT AND METHODS FOR MANUFACTURING THE SAME

CROSS-REFERENCE TO RELATED APPLICATION

This application claims the priority and benefit of Korean Patent Application No. 10-2016-0016055, filed on Feb. 12, 2016, with the Korean Intellectual Property Office, the entire contents of which is incorporated herein by reference.

BACKGROUND

1. Field

The inventive concept relates to a light source module, a display panel, and a display device.

2. Description of Related Art

Semiconductor light emitting diodes (LEDs) have been used as light sources in various electronic products, as well as light sources in lighting devices. In particular, semiconductor LED devices are being widely used as light sources in various display devices, such as TVs, mobile phones, PCs, laptop PCs, and PDAs.

Display devices commonly include display panels, such as liquid crystal display (LCD) panels, and backlights. However, recently, display devices using an LED device as a single pixel that do not require use of a backlight have been become popular. Such display devices may be made to be compact, and may be implemented as high luminance displays with improved optical efficiency as compared to conventional LCDs. In addition, such display devices may be designed and manufactured to easily change an aspect ratio of the display, and also may be implemented in large areas, thereby providing large displays having various forms.

However, there is a problem in that target color coordinates are difficult to implement in such LED display panels due to variations in optical characteristics (e.g. peak wavelength or luminance characteristics) of LED chips forming the sub-pixels.

SUMMARY

Example embodiments provide an LED sub-pixel, an LED pixel comprising a plurality of sub-pixels, LED light source module with improved color characteristics, a display panel or other display device including the same, as well as methods of manufacturing the same.

According to some examples, a semiconductor device may comprise a first pixel comprising a red sub-pixel configured to emit first light having a primary peak intensity of red light, such as having a wavelength within a first peak range of 630 to 780 nm, a green sub-pixel configured to emit second light having a primary peak intensity of green light, such as having a wavelength within a second peak range of 500 to 600 nm, and a blue sub-pixel configured to emit third light having a primary peak intensity of blue light, such as having a wavelength within a third peak range of 420 to 480 nm, the red sub-pixel, the green sub-pixel and blue sub-pixel being located adjacent to each other, the red sub-pixel, the green sub-pixel and the blue sub-pixel each comprising a light emitting diode and a transmissive material positioned to receive light from the corresponding light emitting diode, wherein a first sub-pixel is one of the red sub-pixel, the green sub-pixel and the blue sub-pixel, and second sub-pixels are others of the red sub-pixel, the green sub-pixel and the blue sub-pixel that are not the first sub-pixel, wherein the first sub-pixel comprises a tuning phosphor embedded in the transmissive material of the first sub-pixel, the tuning phosphor having a material property to absorb light emitted by the light emitting diode of the first sub-pixel and emit light that does not have a wavelength of the absorbed light, causing the light emitted by the first sub-pixel to have a secondary peak intensity having a wavelength within the peak range of one of the second sub-pixels. Sub-pixels generating colors other than red, green and blue may be used to form a pixel as well, where at least one of these sub-pixels includes a wavelength converting material to emit light other than the main color of light the sub-pixel emits.

A display panel or other display device may be formed of a plurality of such pixels.

According to some examples, a method of manufacturing comprises forming a portion of a pixel, including forming first, second and third light emitting diodes as part of first, second and third sub-pixels; applying a voltage across electrodes of the first light emitting diode to cause the first light emitting diode to emit light; measuring an intensity of light emitted by the first light emitting diode; in response to the measuring of the intensity of light, determining an amount of a tuning phosphor; and forming a first transmissive material on the first sub-pixel with a tuning phosphor, an amount of the tuning phosphor within the transmissive material being selected in response to the measuring of the intensity of light emitted by the first light emitting diode.

The methods may comprise forming the first light emitting diode, the second light emitting diode and the third light emitting diode on a semiconductor wafer; and singulating a semiconductor chip from the semiconductor wafer, the semiconductor chip comprising the first light emitting diode, the second light emitting diode and the third light emitting diode, wherein the forming of the first transmissive material on the first sub-pixel is performed while the semiconductor chip is part of the semiconductor wafer, prior to the semiconductor chip being singulated from the wafer.

The first sub-pixel may be a blue sub-pixel, the second sub-pixel may be a green sub-pixel and the third sub-pixel may be a red sub-pixel, the blue sub-pixel, the green sub-pixel and the red sub-pixel being located adjacent to each other. The first transmissive material may be embedded with a first phosphor on the first light emitting diode to emit first light having a primary peak intensity of blue light having a wavelength less than 500 nm and a secondary peak intensity of first green light having a wavelength between 500 nm and 600 nm, the primary peak intensity of blue light being greater than the secondary peak intensity of the first green light.

The green sub-pixel may comprise a second transmissive material embedded with a second phosphor on the second light emitting diode to emit second light having a peak intensity of second green light having a wavelength between 500 nm and 600 nm. The red sub-pixel may comprise a third transmissive material embedded with a third phosphor on the third light emitting diode to emit third light having a peak intensity of red light having a wavelength of 600 nm or more.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
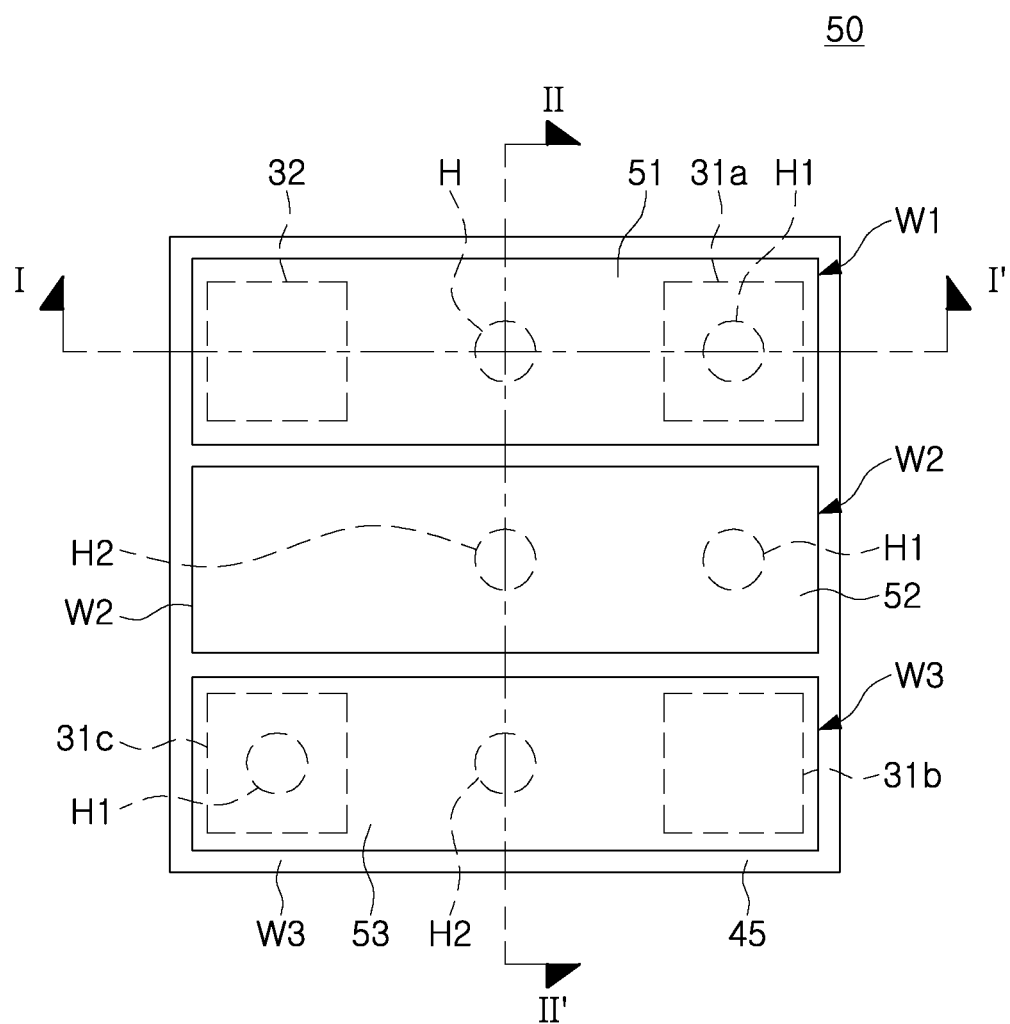
FIGS. 1 and 2 are respectively a top view and a bottom view schematically illustrating a light source module according to an example embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Figure 2:
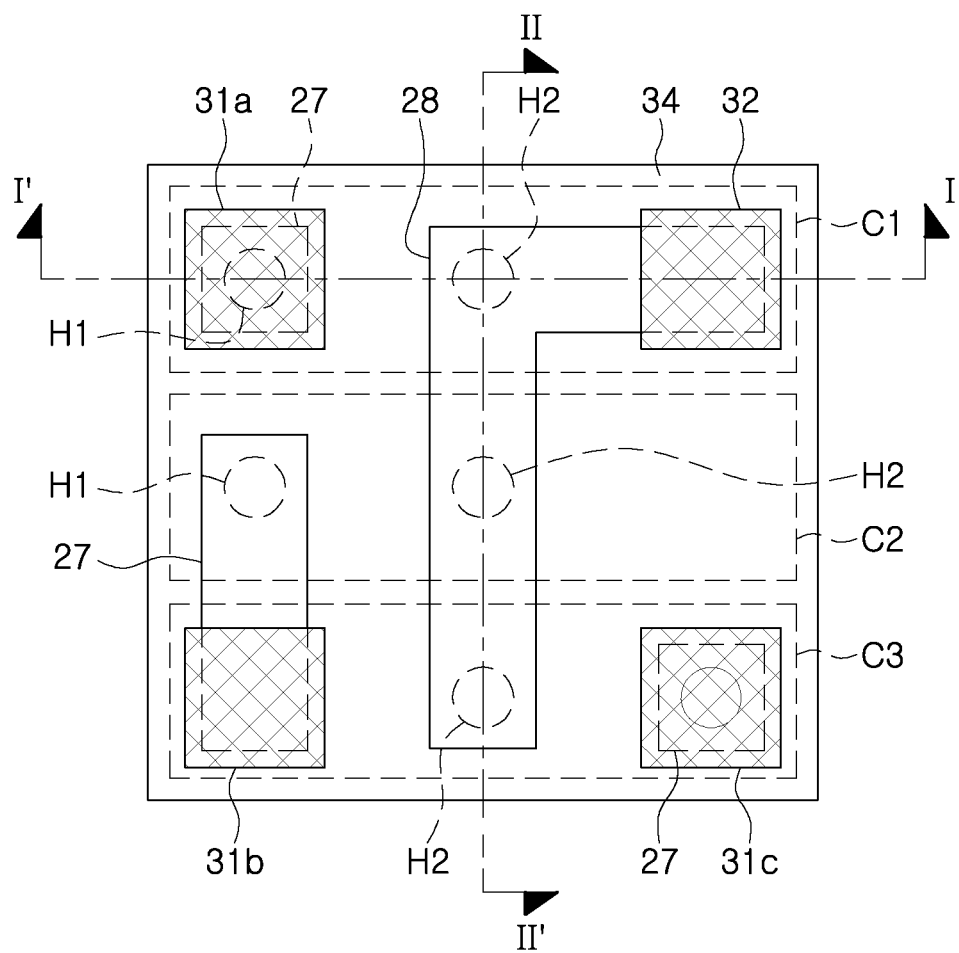
Figure 3:
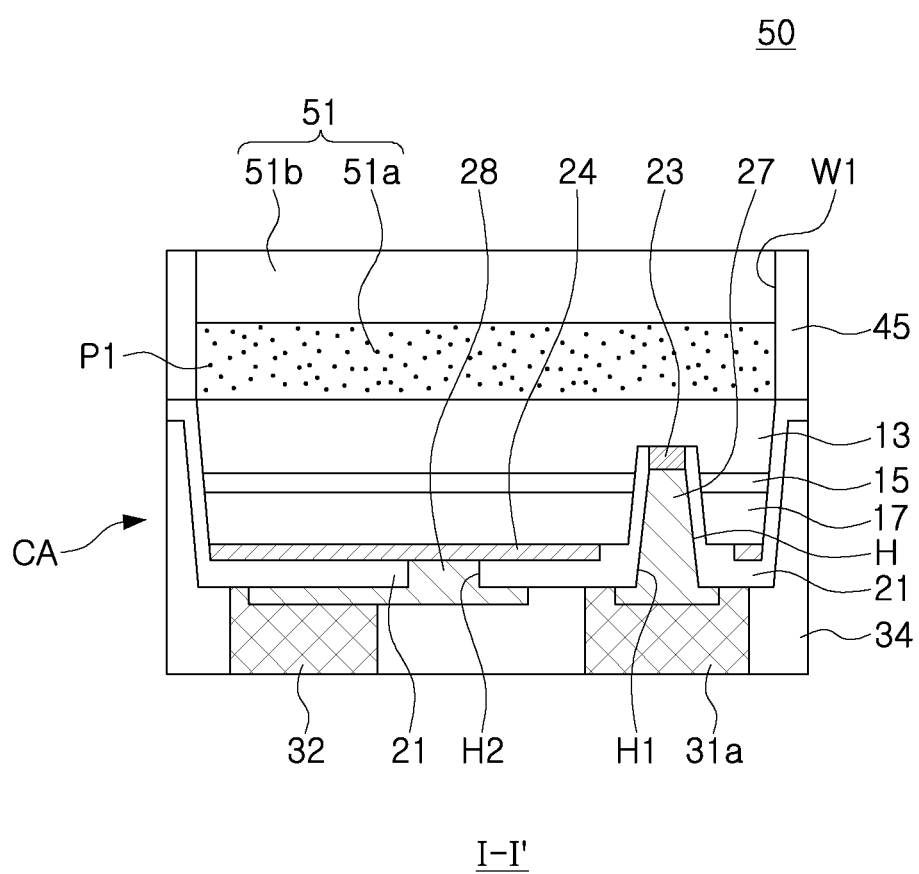
FIGS. 3 and 4 are side cross-sectional views respectively taken along lines I-I' and II-II' of the light source module illustrated in FIG. 1.
Figure 4:
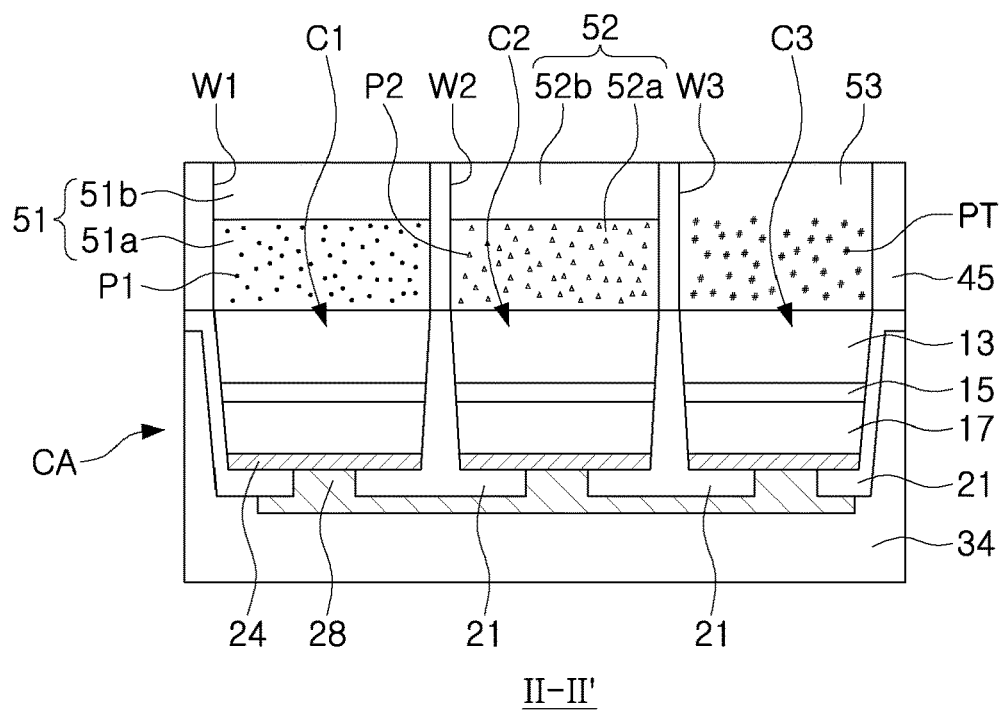

FIGS. 1 and 2 are respectively a plan view and a bottom plan view schematically illustrating a light source module according to an example embodiment of the present inventive concept, and FIGS. 3 and 4 are side cross-sectional views respectively taken along lines I-I' and II-II' of the light source module illustrated in FIG. 1.

Referring to FIGS. 3 and 4, together with FIGS. 1 and 2, a light-emitting diode (LED) light source module 50 according to the example embodiment may include a cell array CA including first to third LED cells C1, C2, and C3, first to third light-controlling parts 51, 52, and 53 respectively disposed to correspond to the first to third LED cells C1, C2, and C3 on one surface of the cell array CA, and a sidewall 45 separating the first to third light-controlling parts 51, 52, and 53.

Each of the first to third LED cells C1, C2, and C3 may include a first conductivity-type semiconductor layer 13, an active layer 15, and a second conductivity-type semiconductor layer 17, as illustrated in FIGS. 3 and 4. The first conductivity-type semiconductor layer 13, the active layer 15, and the second conductivity-type semiconductor layer 17 may be formed of the same materials, such as epitaxial crystalline layers that are epitaxially grown on a single wafer in the same process. The active layers 15 of the first to third LED cells C1, C2, and C3 may be formed to emit the same color of light (e.g., emit light having the same wavelengths and/or the same spectrum of light). For example, the active layers 15 may emit blue light (e.g. light having a wavelength in range of 440 nm to 460 nm) or ultraviolet light (e.g. light having a wavelength of 380 nm to 440 nm).

The cell array CA may include an insulating part 21 surrounding the first to third LED cells C1, C2, and C3. The insulating part 21 may electrically isolate the first to third LED cells C1, C2, and C3 from each other. As illustrated in FIG. 4, the insulating part 21 may have a top surface that is substantially co-planar with top surfaces of the first to third LED cells C1, C2, and C3, such top surfaces forming a planar top surface of the cell array CA (horizontal and perpendicular with respect to FIG. 4) and forming an internal surface of the light source module 50. Such co-planarity of the top surfaces and the planarity of the top surface of the cell array CA may be obtained by removing a wafer used as a growth base and support structure from the top surface of the cell array CA, after isolating the first to third LED cells C1, C2, and C3 and forming the insulating part 21.

The insulating part 21 may be an electrically insulating material. For example, the insulating part 21 may be silicon oxide, silicon oxynitride, or silicon nitride. The insulating part 21 according to the example embodiment may further include a material having low light absorption, or a reflective material or structure. Such a reflective insulating part 21 may block mutual optical interference to ensure independent operations of the first to third LED cells C1, C2, and C3. In some example embodiments, the insulating part 21 may have a distributed Bragg reflector (DBR) structure in which a plurality of insulating layers having different respective refractive indices are alternately stacked. When the insulating part 21 is formed as a DBR structure, the plurality of insulating layers having different refractive indices may be repeatedly stacked, such as 2 to 100 times. Such plurality of insulating layers may be selected from oxides or nitrides, such as two or more of $SiO_2$, $SiN$, $SiO_xN_y$, $TiO_2$, $Si_3N_4$, $Al_2O_3$, $ZrO_2$, $TiN$, $AlN$, $TiAlN$, and $TiSiN$.

The reflective insulating part 21 and the sidewall 45 may be connected to each other. The sidewall 45 may be formed to vertically extend from the insulating part 21. Since the reflective insulating part 21 and the sidewall 45 are provided to have a structure that surrounds each of the first to third LED cells C1, C2, and C3 and each of the first to third light-controlling parts 51, 52, and 53, optical interference between the first to third LED cells C1, C2, and C3 may be effectively blocked. Thus, the entire optical paths of the light generated from the first to third LED cells C1, C2 and C3 may be effectively isolated from one another.

The bottom surface of the LED light source module 50 may be formed as the other major surface of the cell array CA, and may include an electrode part electrically connected to the first to third LED cells C1, C2, and C3. The electrode part may be configured to selectively drive the first to third LED cells C1, C2, and C3.

In the example embodiment, as illustrated in FIG. 2, the electrode part may include three first electrode pads 31a, 31b, and 31c respectively connected to the three cells C1, C2, and C3, and a second electrode pad 32 commonly connected to the three cells C1, C2, and C3. Each of the electrode pads 31a, 31b, 31c and 32 may be an external terminal to provide an electrical connection to LED light source module 50, and be exposed with respect to encapsulation 34.

The three first electrode pads 31a, 31b, and 31c may be independently connected to the first conductivity-type semiconductor layers 13 of the first to third LED cells C1, C2, and C3 by three first connection electrodes 27. The second electrode pad 32 may be commonly connected to the second conductivity-type semiconductor layers 17 of the first to third LED cells C1, C2, and C3 by a single second connection electrode 28. The first and second connection electrodes 27 and 28 may be respectively connected to the first and second conductivity-type semiconductor layers 13 and 17 via first and second through-holes H1 and H2 formed in the insulating part 21. The electrode part according to the example embodiment may further include first and second contact electrodes 23 and 24. The first and second through-holes H1 and H2 may partially expose the first and second contact electrodes 23 and 24 to be connected to the first and second connection electrodes 27 and 28. While the first connection electrodes 27 are independently formed in three first through-holes H1, the second connection electrode 28 may be formed in such a manner that portions thereof formed in three second through-holes H2 are connected to each other. Such a structure of the electrode part may be variously changed according to the arrangement of the cells and electrode pads. This will be described in detail later.

The LED light source module 50 may include an encapsulation 34 encapsulating the LED cell array CA while exposing the first electrode pads 31a, 31b, and 31c and the second electrode pad 32. The encapsulation 34 may have a high Young's modulus to firmly support the LED light source module 50. In addition, the encapsulation 34 may include a material having a high thermal conductivity to effectively emit heat from the LED cells C1, C2, and C3. For example, the encapsulation 34 may include epoxy resin or silicone resin. In addition, the encapsulation 34 may include a light-reflective particle to reflect light. The light reflective particle may include titanium dioxide ($TiO_2$) or aluminum oxide ($Al_2O_3$), but is not limited thereto.

The sidewall 45 may include first to third emission windows W1, W2, and W3 at locations corresponding to the first to third LED cells C1, C2, and C3. The first to third emission windows W1, W2, and W3 may be respectively provided as spaces for forming the first to third light-controlling parts 51, 52, and 53. The sidewall 45 may include a light-blocking material (an opaque material) to prevent interference of light passing through the first to third light-controlling parts 51, 52, and 53. For example, the sidewall 45 may include a black matrix resin.

The first to third light-controlling parts 51, 52, and 53 may control light emitted from the first to third LED cells C1, C2, and C3 to convert the light into light having different colors. According to the example embodiment, the first to third light-controlling parts 51, 52, and 53 may be configured to provide red light, green light, and blue light, respectively.

As described in the example embodiment, when the first to third LED cells C1, C2, and C3 emit blue light, the first and second light-controlling parts 51 and 52 may include first and second wavelength-converting parts 51a and 52a respectively containing red and green phosphors P1 and P2. As illustrated in FIGS. 3 and 4, the first and second wavelength-converting parts 51a and 52a may be formed by respectively dispensing a light-transmitting (e.g., a material that is transmissive to light, that may be translucent or transparent) liquid resin (which subsequently hardens) including red and green phosphors P1 and P2 into first and second light-emitting windows W1 and W2, but are not limited thereto. The light-transmitting material is a material that is transmissive to light, that may be translucent or transparent (when referring to a light controlling part, "transmissive" means transmissive to light emitted by an LED cell corresponding to the light controlling part, and does not require full transmission of such light). The first and second wavelength-converting parts 51a and 52a may be formed in various other processes. For example, the first and second wavelength-converting parts 51a and 52a may be provided as wavelength-converting films (e.g., separately formed and attached to an upper surface of the LED cells CA).

In this example, the first and second light-controlling parts 51 and 52 may further include light-filtering layers 51b and 52b respectively disposed on the first and second wavelength-converting parts 51a and 52a and selectively blocking blue light. Using the light-filtering layers 51b and 52b, the first and second light-emitting windows W1 and W2 may only provide red light and green light respectively.

As illustrated in FIG. 4, the third light-controlling part 53 according to the example embodiment may include a tuning wavelength-converting material PT. The tuning wavelength-converting material PT may be a wavelength-converting material using light emitted from the third LED cell C3 as excitation light to emit light having a different color from the majority of light emitted from the sub-pixel including the third LED cell C3. For example, the tuning wavelength-converting material PT may include one or more of the green and red phosphors to convert light emitted from the third LED cell to a second color, such as to green or red light, where the majority of light emitted from sub-pixel B is blue light (e.g., having a wavelength less than 500 nm or less than 480 nm, such as between 420 nm and 480 nm or between 440 nm and 460 nm). In some examples, the majority of light emitted from sub-pixel B may have a wavelength of the light generated by the third LED cell (e.g., the majority of light emitted from sub-pixel may be generated by the third LED cell CA of the sub-pixel. In some examples, a wavelength-converting material to emit light of a first color, such as a blue or bluish green (e.g. light having a wavelength in the range of 480 nm to 520 nm), may also be included in the tuning wavelength-converting material PT. In this example, since the tuning wavelength-converting material PT is adopted to adjust color coordinates of the blue light provided by the third light-controlling part 53, a content of the phosphor in the tuning wavelength-converting material PT may be lower than contents of phosphors used as a wavelength-converting material in the other wavelength-converting parts 51a and 52a providing the other colors.

Figure 5:
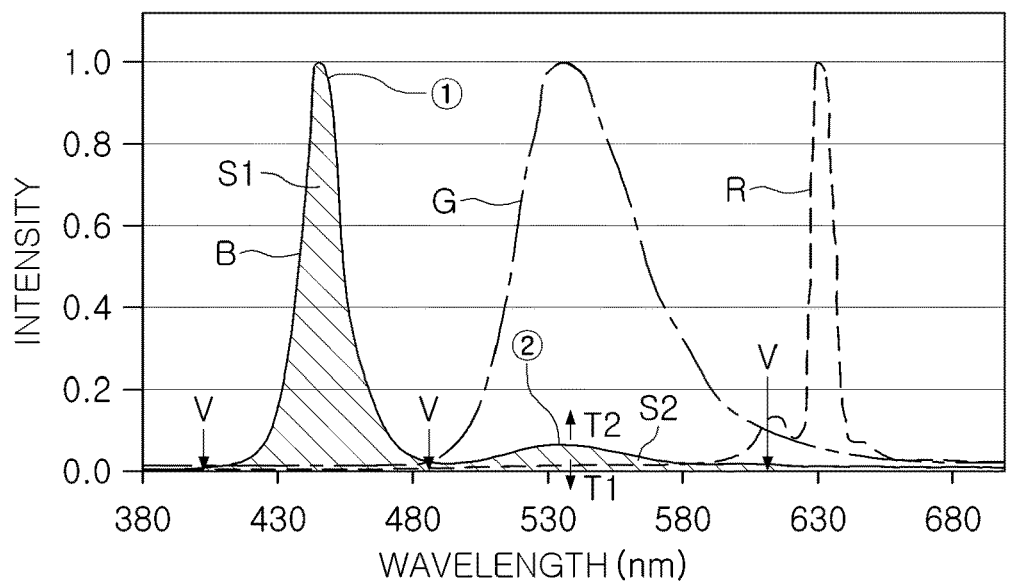
FIG. 5 illustrates a light emission spectrum of a light source module according to an example embodiment.

FIG. 5 illustrates an example of a light emission spectrum of a light source module according to an example embodiment.

Referring to FIG. 5, in the light emission spectrum, the light output by the sub-pixels R, G, B including the light respectively adjusted by the first to third light-controlling parts 51, 52, and 53 is shown as R, G, and B, respectively (each having a normalized intensity as shown in FIG. 5). The blue light B adjusted in the third light-controlling part 53 may be configured to have a first peak ① and a second peak ② having a lower intensity than the first peak 1. The first peak ① may be the maximum intensity emitted by the blue sub-pixel B and the second peak ① may correspond to a local maximum of the intensity emitted by the blue sub-pixel B. Reference herein to a "peak wavelength" refers to the wavelength of light corresponding to a particular peak, such as the first peak ① or second peak 1. The first peak ① may be a main peak belonging to a preferred color gamut (e.g., blue in this example), and the second peak ② may be a sub-peak belonging to another wavelength band so as to tune color coordinates. The second peak ② may be a local maximum of the intensity having the largest intensity among all local maximums other than the first peak ① or other local maximums may have a greater intensity. Additionally or alternatively, the second peak ② may correspond to a local maximum of the intensity with a peak wavelength of 500 nm or greater and/or with a peak wavelength of 50 nm greater than the first peak wavelength and/or 80 nm or greater than the first peak wavelength. The intensities herein reflect intensity measurements of a spectrometer having a resolution with a full width at half maximum of approximately XX nm. As is known, the resolution of the spectrometer reflects the ability of the spectrometer to measure the intensity of the wavelength of interest and to remove (filter) light outside the wavelength of interest. However, it will be appreciated that higher resolution measurements may reveal other local minimums of the intensity measurements, resulting in additional local maximums which may be considered in this description as part of larger local maximum. Thus, the light intensity peaks (peak wavelengths), minimums, valleys, etc., as referred to in this specification and claims refer to intensity peaks/minimums/valleys corresponding to intensity measurements having a spectral resolution no less than a full width at half maximum of YY nm.

In some example embodiments, a wavelength of the first peak ① may be in a range of 440 nm to 460 nm, and a wavelength of the second peak ② may be in a range of 500 nm to 600 nm, between 520 nm to 600 nm and/or less than 550 nm (e.g., greater than 500 nm or 520 nm and less than 550 nm). More specifically, according to the example embodiment, the wavelength of the first peak ① may be a blue peak wavelength of blue light, and may correspond to light emitted from the third LED cell C3, and the wavelength of the second peak ② may be a green peak wavelength of green light. In some example embodiments, the tuning wavelength-converting material PT of the third light-controlling part 53 may include a green phosphor to generate the green light of the second peak, and such green phosphor may be the same (e.g., having the same composition) as the green phosphor P2 of the second light-controlling part 52. In this case, the amount of green phosphor of the tuning wavelength-converting material PT of the third light-controlling part 53 may be lower than the amount of the green phosphor P2 of the second light-controlling part 52. The second peak ② of the green light emitted from the third LED cell C3 may have a wavelength within 20 nm, and/or within 10 nm and/or may be substantially the same as the wavelength of the peak intensity of the light emitted from the second LED cell C2.

As described above, unlike the example embodiment, the wavelength of the second peak ② may be within another visible light band, such as a bluish green band (e.g. 480 nm to 520 nm), a yellowish red band (e.g. 600 nm to 630 nm), or a red band (e.g. 630 nm to 780 nm). Such a wavelength may be selected depending on a type of the tuning wavelength-converting material PT. When the wavelength of the second peak ② of the tuning wavelength-converting material PT is adjacent to the wavelength of the first peak 1, for example, in the case of a bluish green phosphor, the light emitted from the third light-controlling part 53 may have a spectrum only having a single maximum which corresponds to the first peak 1.

According to the example embodiment, the color coordinates of the blue light in the CIE 1931 color space chromaticity diagram (which may be referred to herein simply as the CIE 1931 color space chromaticity diagram) may be tuned by adjusting the intensity of the second peak 2. For example, the intensity of the second peak ② may be tuned during the design and/or manufacturing of the LED light source module 50 by changing the type and/or amount of the tuning wavelength-converting material PT. As another tuning method, the intensity of the second peak ② may be adjusted using a light-absorbing material selectively absorbing light having a specific wavelength (for example, as described with respect to FIG. 8), or controlling a mixing ratio of different wavelength-converting materials (for example, as described with respect to FIG. 9).

The content and/or affect of the tuning wavelength-converting material PT may be represented by an area of a spectrum associated with a peak wavelength and/or associated with ranges of spectrum having wavelengths of colors other than blue (e.g., greater than 480 nm, greater than 500 nm or greater than 520 nm). In the example of FIG. 5, the content of the tuning wavelength-converting material PT may be described by an area obtained by integrating the spectrum between valleys v adjacent to the peak wavelength (the integral of light intensity represented by the y-axis between two wavelengths associated with the valleys v with respect to the x-axis (wavelength)). Here, the valleys v may include a zero intensity point (or within a predetermined threshold of a zero intensity point) as well as the lowest intensity point between peaks. Identification of the valleys may be restricted to be below a certain percentage of the peak intensity of the sub-pixel, such as below 5%, below 2% or below 1%, e.g. In the example of FIG. 5, the area S1 corresponds to an integral of the intensity waveform of the intensity of light emitted from the blue sub-pixel B between approximately 400 nm and approximately 490 nm, while the area S2 corresponds to an integral of the intensity waveform of the intensity of light emitted from the blue sub-pixel B between approximately 490 nm and approximately 600 nm.

Figure 6A:
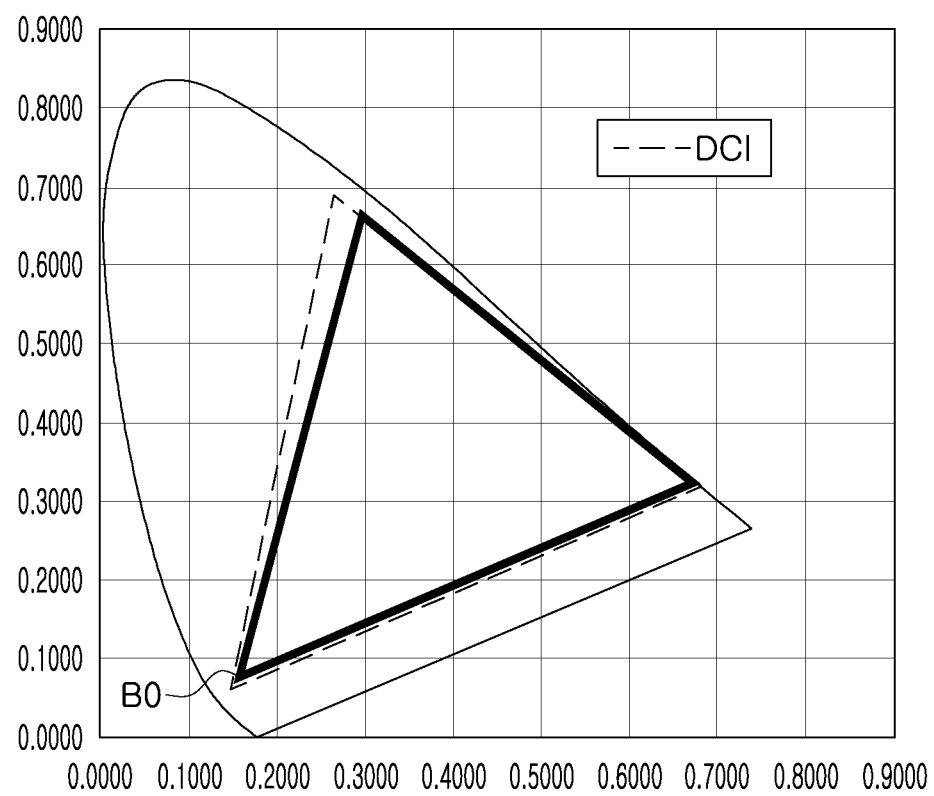
FIGS. 6A to 6C are graphs illustrating tuning of color coordinates according to the intensity of a sub-peak in the light emission spectrum illustrated in FIG. 5.
Figure 6B:
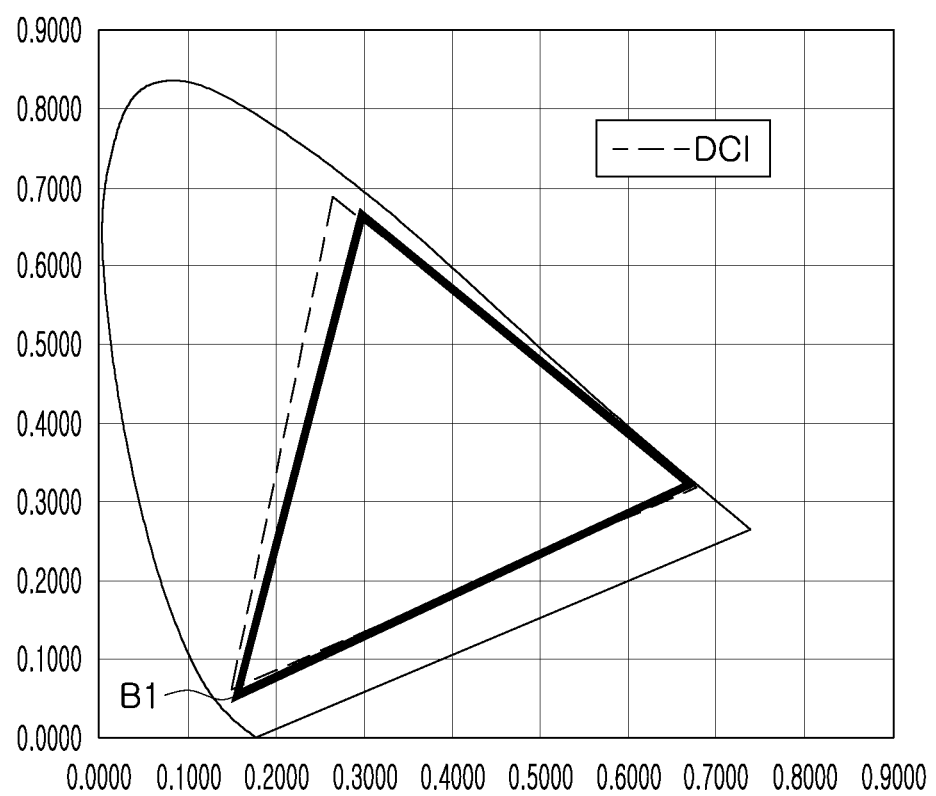
Figure 6C:
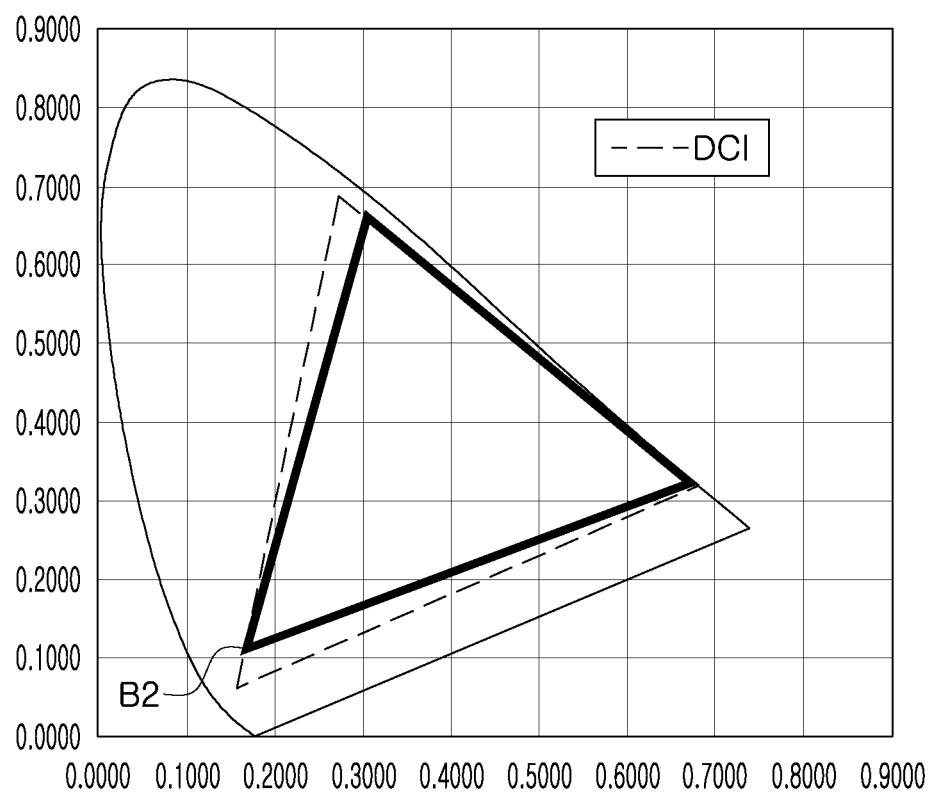

The solid line triangles of FIGS. 6A, 6B and 6C show the color space of the LED light source module 50 with different third sub-pixels B having different light controlling parts 53. When a green phosphor as the tuning wavelength-converting material PT is included in the third light-controlling part 53 in such a manner that a ratio S2/S1 of a spectrum area S2 of the wavelength of the second peak ② to a spectrum area S1 of the wavelength of the first peak ① was about 12.7%, the coordinates of the blue light in the CIE 1931 color space chromaticity diagram was B0(0.159, 0.073), as illustrated in FIG. 6A. However, when the area ratio S2/S1 was reduced to about 6.5% (T1) (e.g., by lowering the content of the tuning wavelength-converting material PT and/or adding another light-absorbing material), the coordinates of the blue light was moved to B1(0.157,0.055), as illustrated in FIG. 6B.

Conversely, when the area ratio S2/S1 was increased to about 20.3% (T2) by increasing the content of the tuning wavelength-converting material PT, the coordinates of the blue light were moved to B2(0.163,0.109), as illustrated in FIG. 6C. It is shown that such a movement was done in almost opposite direction to the coordinates B1.

In this manner, the third light-controlling part 53 according to the example embodiment may provide the sub-peak, that is, the second peak 2, having a different wavelength from the main peak, and the color coordinates (e.g. a coordinates in the CIE 1931 color space chromaticity diagram) may be tuned to approximate a target color coordinate by using the sub-peak.

As illustrated in FIG. 6C, the color gamut tends to be lowered as the content of the tuning wavelength-converting material PT increases. Due to this tendency, color reproducibility of a light source module may be degraded. In this regard, when using the wavelength-converting material PT to tune the color coordinates, it may be desired to keep the spectrum area S2 of the wavelength of the second peak ② to be 20% of the spectrum area S1 of the wavelength of the first peak ① less.

In the examples described herein, when the blue sub-pixel B comprises a light controlling part 53 with a tuning wavelength-converting material PT converting light to a wavelength other than blue light, the light emitted by the blue sub-pixel B may have a z coordinate in the CIE 1931 XYZ color space chromaticity diagram of 0.62 or greater, and may be 0.76 or greater. For example, such blue light emitted from the blue sub-pixel B may have peak intensity (main peak) having a wavelength of less than 500 nm, such as between 420 nm and 480 nm, and the light of the blue sub-pixel B resulting from use of the tuning wavelength converting material PT may have a peak intensity (e.g., sub-peak) having a wavelength greater than 500 nm, such as between 500 nm and 600 nm, between 520 nm and 600 nm, and/or less than 550 nm (e.g., greater than 500 nm or 520 nm and less than 550 nm), or as otherwise described herein. The peak intensity (main peak) of a green sub-pixel G forming a pixel PA with such a blue sub-pixel B (e.g., adjacent to each other as part of the same LED light source module or display panel) may also have a wavelength between 500 nm to 600 nm. The relative strengths of these main peak intensities and the intensity of the sub-peak, as well as the spectrums of light associated with these main peaks and sub-peak, may be the same as described elsewhere herein.

As noted herein, sub-pixels other than a blue sub-pixel may include a tuning wavelength converting material, such as the red and green sub-pixels R, G described herein. The tuning wavelength converting material may convert the light emitted from the LED cell CA of that pixel to a color other than the color (e.g., to red or blue for a green sub-pixel G, or to green or blue for a red sub-pixel R). In the examples described herein, when the green sub-pixel G comprises a light controlling part 52 with a tuning wavelength-converting material PT converting light to a wavelength other than green light, the light emitted by the green sub-pixel G may have a y coordinate in the CIE 1931 XYZ color space chromaticity diagram of 0.65 or greater. For example, such green light emitted from the green sub-pixel G may have a peak intensity (main peak) having a wavelength of between 500 nm and 600 nm, such as between 525 nm and 580 nm, and the light of the green sub-pixel G resulting from use of the tuning wavelength converting material PT may have a peak intensity (e.g., sub-peak) having a wavelength outside the range of 500 nm to 600 nm. For example, the light of the green sub-pixel G resulting from use of the tuning wavelength converting material PT may be blue light and have a peak intensity (e.g., sub-peak) having a wavelength within the range of 420 nm and 480 nm. In such a case, the blue sub-pixel B forming a pixel PA with such a green sub-pixel G (e.g., adjacent to each other as part of the same LED light source module or display panel) may also have a peak intensity (main peak) having a wavelength between 420 nm and 480 nm. Alternatively, the light of the green sub-pixel G resulting from use of the tuning wavelength converting material PT may be red light and have a peak intensity (main peak) having a wavelength within the range of 630 nm to 780 nm. In such a case, a red sub-pixel R forming a pixel PA with such a green sub-pixel G (e.g., adjacent to each other as part of the same LED light source module or display panel) may also have a peak intensity (main peak) having a wavelength within the range of 630 nm to 780 nm. The relative strengths of these main peak intensities and the intensity of such a sub-peak, as well as the spectrums of light associated with these main peaks and sub-peak, may be the same as those described elsewhere herein regarding the blue sub-pixel B having the tuning wavelength converting material.

In the examples described herein, when the red sub-pixel R comprises a light controlling part 51 with a tuning wavelength-converting material PT, converting light to a wavelength other than red light, the light emitted by the red sub-pixel R may have a x coordinate in the CIE 1931 XYZ color space chromaticity diagram of 0.65 or greater. For example, such red light emitted from the red sub-pixel R may have a peak intensity having a wavelength greater than 600 nm, such as between 630 nm to 780 nm, and the light resulting from use of the tuning wavelength converting material PT may have a peak intensity having a wavelength less than 630 nm, such as between the range of 500 nm to 600 nm. The relative strengths of these main peak intensities and the intensity of such a sub-peak, as well as the spectrums of light associated with these main peaks and sub-peak, may be the same as those described elsewhere herein regarding the blue sub-pixel B having the tuning wavelength converting material.

In some examples, upon applying a first driving voltage to the LED cell C3, the blue sub-pixel B may emit light (e.g., blue light of the LED cell and light having a different wavelength (e.g., green light) after converting the wavelength of the blue light emitted by the LED cell C3 by tuning wavelength-converting material PT). The light emitted by the blue sub-pixel B may have a first peak intensity ① of blue light (e.g., having wavelength(s) less than 500 nm) of M watts, and have a second peak intensity ② of green light (e.g., having wavelength(s) between 500 nm and 600 nm) of N watts. The first driving voltage may be a fixed or predetermined voltage, such as maximum driving voltage, or half of the maximum driving voltage, of a driving circuit (e.g., display driver IC) connected to drive the LED cell C3 in a display panel or other display device. M and N may be real numbers where N is greater than 4% of M. In some examples, N may be greater than 4% but less than 8% of M. In some examples, when the first driving voltage (e.g., having the same magnitude as the driving voltage applied to the LED cell C3 of the blue-sub pixel B) is applied to drive the LED cell C2 of the green sub-pixel G, light emitted by the green sub-pixel G may have a peak intensity of green light (e.g., having wavelength(s) greater than 500 nm and less than 600 nm) of L watts. L may be a real number, and N may be greater than 4% of L. In some examples, N may be greater than 4% but less than 8% of L. In some example embodiments, in consideration of an effect of tuning of the color coordinates, the second peak ② may be disposed in a wavelength band having high visibility. For example, the second peak ② may be selected to be disposed in a range of 520 nm to 600 nm or in a range of 525 nm to 580 nm. In addition, a difference in the wavelengths of the first peak ① and the second peak ② may be 50 nm or more, or 80 nm or more, but is not limited thereto. For example, when a tuning range of the color coordinates is narrow, the second peak ② having a wavelength adjacent to a wavelength of the first peak ① may be selected.

Figure 7:
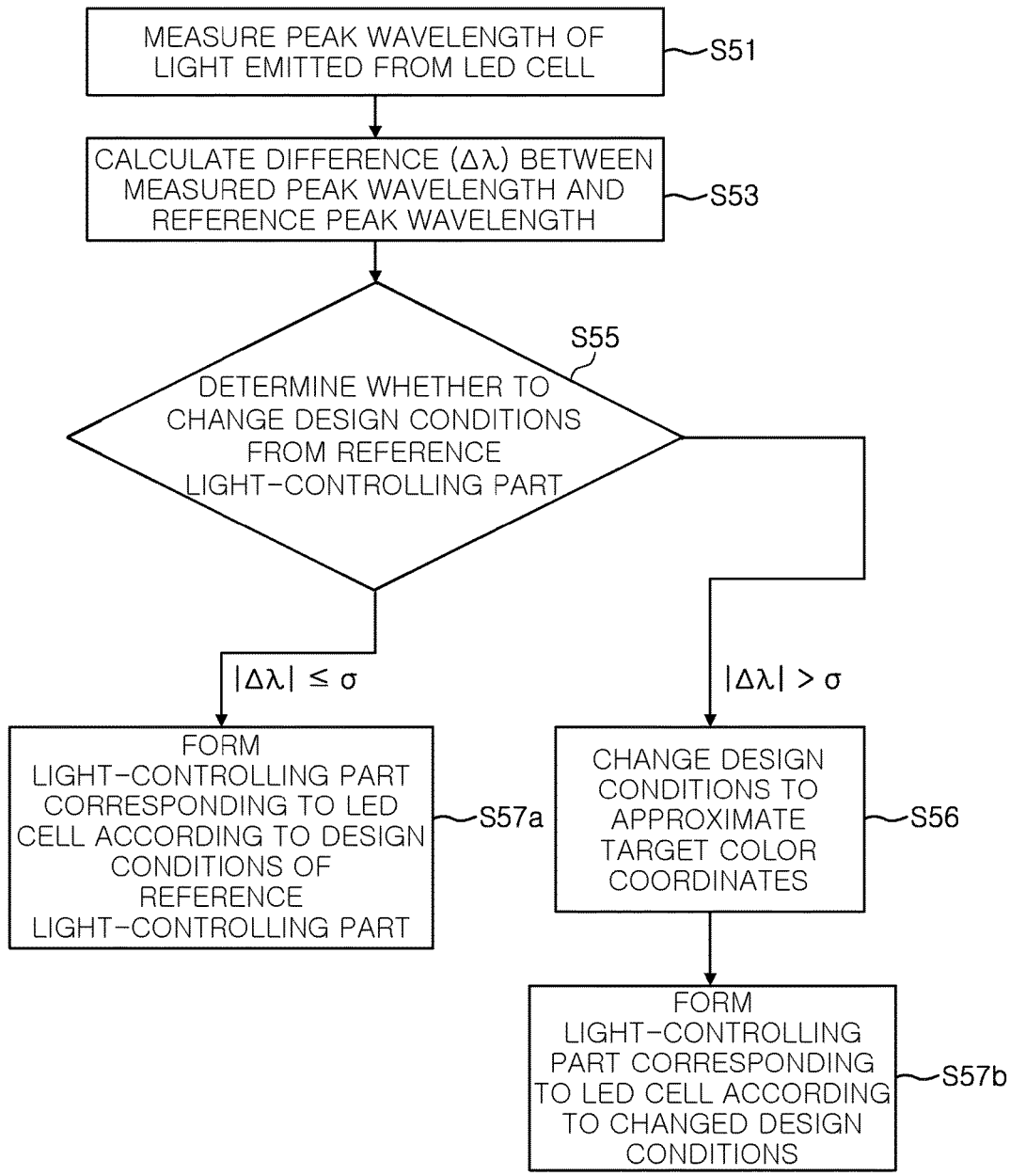
FIG. 7 is a flowchart illustrating an example of a method of tuning color coordinates of a light source module according to an example embodiment.

Such a method of tuning the color coordinates may be utilized as a method of correcting deviations in the color coordinates generated due to wavelength characteristics of LEDs. FIG. 7 is a flowchart illustrating an example of a method of tuning color coordinates of a light source module according to an example embodiment of the present inventive concept.

Referring to FIG. 7, the intensity of light emitted from an LED cell (e.g., such as LED cell CA of FIG. 4) is measured (e.g., by a spectrometer) over a continuous spectrum of wavelengths to obtain information representing intensity v. wavelength of the emitted light such as shown in FIG. 5. The LED cell may not have any light controlling part (e.g., such as 51, 52 or 53) formed thereon. A peak wavelength of the light emitted from an LED cell (the wavelength corresponding to the maximum intensity of light emitted from an LED cell) is determined (S51). In this measurement process, various wavelength characteristics such as brightness, as well as the peak wavelength, may be measured. The measurement process may be a wafer-level process where each LED cell formed on a wafer is separately measured while still formed as part of a wafer (after which, they may be singulated from the wafer). Alternatively, each LED cell may be measured after singulation from the wafer and its wafer location may be tracked. Actually, even when LED cells are fabricated on the same wafer in the same process, the LED cells may have different wavelength characteristics depending on locations on the wafer or the number of processes. Such different optical characteristics may cause the deviations in color coordinates of the light source modules fabricated under the same conditions (e.g. the same design conditions of the wavelength-converting part). To solve the problem, inventors of the present inventive concept suggest a sub-peak as a basic condition, and a method of tuning color coordinates so as to control the intensity of the sub-peak (an area ratio of a spectrum).

Next, the measured peak wavelength is compared to a reference peak wavelength (S53). In the comparative process, a difference (Δλ) between the measured peak wavelength and the reference peak wavelength may be calculated. Here, a target peak wavelength of the LEDs or a peak wavelength most closely matching the peak wavelength of the majority of formed LED cells (e.g., with the most distributions) in an actual manufacturing process may be set as the "reference peak wavelength". In regard to such a reference peak wavelength, design conditions of a reference light-controlling part for obtaining the target color coordinates may be predetermined.

Here, "the design conditions of the reference light-controlling part" or "reference design conditions" may refer to configuration requirements of the light-controlling part for converting light having the reference peak wavelength into light having the target color coordinates. For example, the reference design conditions may include various parameters, such as a type and amount of a base wavelength-converting material, a type and amount of a tuning wavelength-converting material, whether a light-absorbing material is added or not and an amount of the light-absorbing material, and a mixing ratio of two or more wavelength-converting materials. In addition, as described above, the design conditions of the reference light-controlling part may be set in such a manner that if an LED sub-pixel were formed by combining the reference light-controlling part with an LED cell that having a peak wavelength equal to the reference peak wavelength, the adjusted light emitted from such an LED sub-pixel would have a spectrum including a first peak (a main peak) wavelength and a second peak (a sub-peak) wavelength having lower intensity than the first peak wavelength (such as described elsewhere herein).

Next, whether the design of the reference light-controlling part is to be changed or not may be determined based on the difference ($\Delta\lambda$) between the measured peak wavelength and the reference peak wavelength (S55).

In making such a determination, an allowable deviation ($\sigma$) may be set even when there is a difference ($\Delta\lambda$) between the measured peak wavelength and the reference peak wavelength. When the difference ($\Delta\lambda$) between the measured peak wavelength and the reference peak wavelength is within an allowable deviation ($\sigma$) (that is, $|\Delta\lambda|\leq\sigma$), the light-controlling part to be combined with the measured LED cell may be one formed according to the design conditions of the reference light-controlling part (S57a). However, when the difference ($\Delta\lambda$) between the measured peak wavelength and the reference peak wavelength exceeds the allowable deviation ($\sigma$) (that is, $|\Delta\lambda|>\sigma$), the design conditions of the reference light-controlling part (to be combined with the measured LED cell) may be changed in such a manner that the spectrum of light associated with the sub-peak is altered (e.g., the intensity of the sub-peak is increased or decreased) (S56), and then a light-controlling part (in particular, the wavelength-converting part) may be one formed according to the changed design conditions (S57b) and combined with the measured LED cell or a similarly manufacture LED cell (e.g., in a manner as described herein).

The change of the reference design conditions may be implemented using various factors. A method of changing the reference design conditions may differ depending on whether a wavelength deviation is a positive number or a negative number. For example, when the measured peak wavelength is shorter than the reference peak wavelength in a blue LED cell, the reference design conditions may be changed in such a manner that light intensity associated with the sub-peak is enhanced. For example, at least one method among 1) increase of the content of the tuning wavelength-converting material related to the sub-peak, 2) decrease of the amount of the light-absorbing material, and 3) addition of another tuning wavelength-converting material (supplying of a second sub-peak), may be selected. On the contrary, when the measured peak wavelength is longer than the reference peak wavelength in the blue LED cell, the reference design conditions may be changed in such a manner that the light associated with the sub-peak is weakened. For example, at least one method among 1) decrease of the content of the tuning wavelength-converting material related to the sub-peak and 2) addition/increase of the amount of the light-absorbing material, may be selected.

The light-controlling part may be formed by depositing (such as by spin coating, or by an ink jet method) a liquid light transmitting resin (that subsequently hardens) containing a tuning wavelength converting material, such as phosphor. The liquid transmitting resin may also include a light absorbing material. The amount (total amount and/or concentration) of a primary tuning wavelength converting material (e.g., phosphor) corresponding to the sub-peak, a secondary tuning wavelength converting material, and/or a light-absorbing material the may be varied depending on (a) the light intensity measurements of the LED cell on which the light-controlling part is formed and/or (b) on the light intensity measurements of other LED cells on the wafer (e.g., to allow measurement of only a few of the LED cells) and/or other light intensity measurements of LED cells on other wafers manufactured in the same lot (e.g., every $100^{th}$ wafer of LED cells may have its LED cells measured and such measurements may be used to determine the amount of primary and/or secondary tuning wavelength converting material and/or light absorbing material of the light controlling part formed on wafers of LED cells formed in the next 99 wafers of LED cells to be manufactured). For the same sub-pixel type (e.g., R, B or G) on the same wafer, the amount of primary and/or secondary tuning wavelength converting material and/or light absorbing material of the light controlling part may vary depending on the location of the light controlling part on the wafer, such as based on measurements of other LED cells in the same relative location within other wafers.

When dispensing the light transmitting liquid resin individually (e.g., by inkjet) to form the light controlling part, controlling the amount of an added material to the light transmitting liquid resin (e.g., primary and/or secondary tuning wavelength converting material and/or light absorbing material) may be performed by controlling the total amount of light transmitting liquid resin having the same concentration of added material that is deposited (which may be followed by further light transmitting liquid resin deposition without the added material) or by controlling the concentration of the added material in the light transmitting liquid resin.

Figure 8:
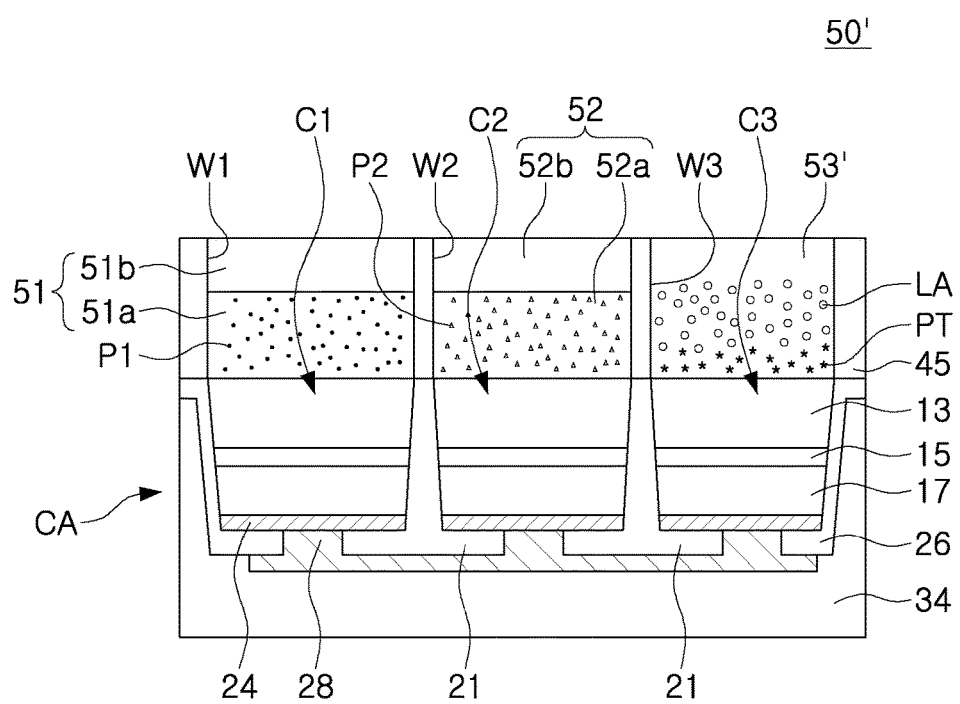
FIG. 8 is a side cross-sectional view illustrating a light source module according to an example embodiment.
Figure 9:
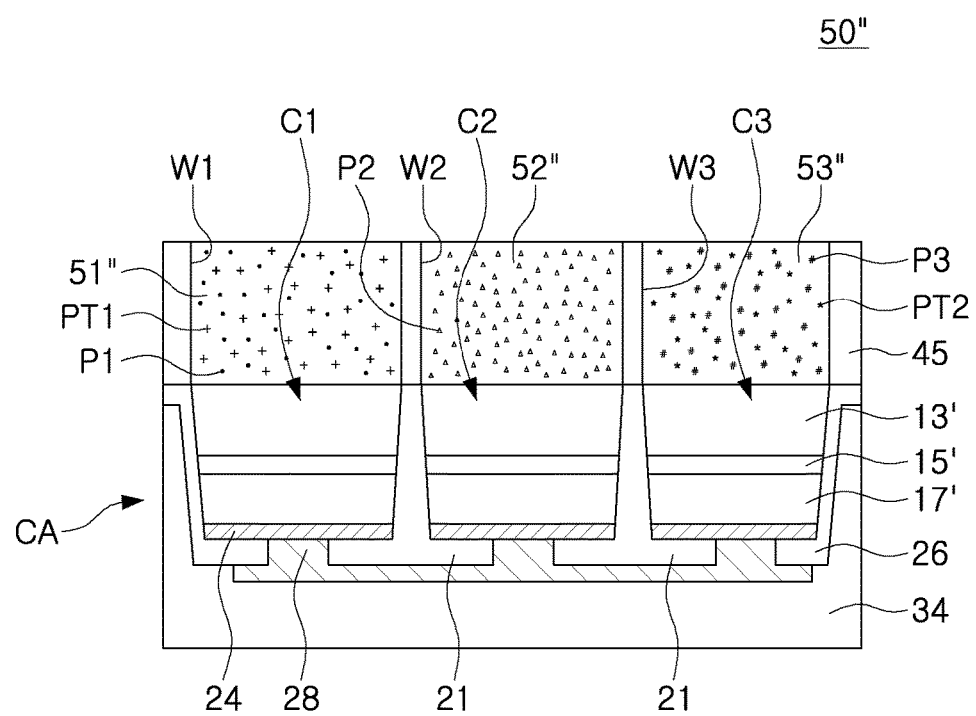
FIG. 9 is a side cross-sectional view illustrating a light source module according to an example embodiment.

LED light source modules having color coordinates tuned according to such various methods are illustrated in FIGS. 8 and 9. FIGS. 8 and 9 may be understood as side cross-sectional views of the LED light source modules, similar to the side cross-sectional view illustrated in FIG. 4.

An LED light source module 50' illustrated in FIG. 8 may be understood to be similar to the LED light source module 50 illustrated in FIG. 4, except that a light-absorbing material LA is added to a third light-controlling part 53'. Components of the LED light source module 50' according to the example embodiment may be understood with reference to the descriptions of components similar to or the same as those of the LED light source module 50 illustrated in FIGS. 1 to 4, unless otherwise specified.

The light-absorbing material LA may be a material absorbing light having a second peak (the sub-peak) wavelength. For example, the light-absorbing material LA may be a light-absorbing pigment or dye. When the light-absorbing material LA is added according to the example embodiment, the intensity of the second peak ② may be adjusted to be reduced (T2) (please refer to FIG. 5), and color coordinates of blue light may be slightly moved to be close to the zero point, similarly to FIG. 6B.

An LED light source module 50" illustrated in FIG. 9 may be understood to be similar to the LED light source module 50 illustrated in FIG. 4, except that first to third LED cells C1, C2, and C3 are ultraviolet LEDs and emit ultraviolet light, and except for a configuration of first to third light-controlling parts 51", 52", and 53". Components of the LED light source module 50" according to the example embodiment may be understood with reference to the descriptions of similar or the same components of the LED light source module 50 illustrated in FIGS. 1 to 4, unless otherwise specified.

The first to third LED cells C1, C2, and C3 may include epitaxial layers 13', 15', and 17' emitting ultraviolet light. For example, the epitaxial layers 13', 15', and 17' may include an active layer 15' having a composition of $Al_xGa_{1-x}N$ (0<x<1). The first and third light-controlling parts 51", 52", and 53" may include red, green, and blue phosphors P1, P2, and P3, respectively.

Figure 10:
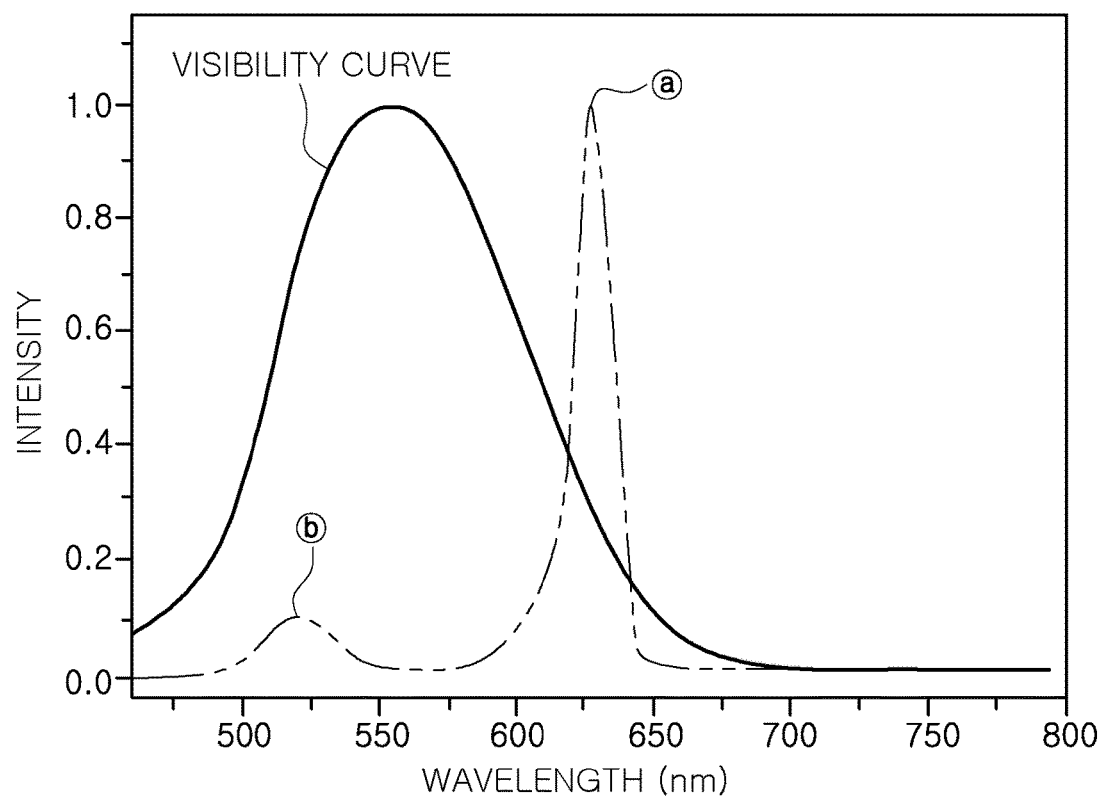
FIG. 10 illustrates a light emission spectrum of the light source module illustrated in FIG. 9.

The first light-controlling part 51" may include a red phosphor P1 for converting ultraviolet light into red light, and a first tuning wavelength-converting material PT1 for providing a sub-peak wavelength different from red color wavelength band. For example, the first tuning wavelength-converting material PT1 may include a yellow (e.g. a wavelength in the range of 570 nm to 600 nm), yellowish red (e.g. a wavelength in the range of 600 nm to 630 nm), or another red wavelength-converting material, other than a blue or green phosphor. As illustrated in FIG. 10, red light emitted by the first light-controlling part 51" may have a spectrum in which a first peak ⓐ is disposed in a red wavelength band (e.g., greater than 600 nm) and a second peak ⓑ is disposed in a green wavelength band (e.g., less than 600 nm, such as between 500 nm and 600 nm). Referring to FIG. 10, the second peak ⓑ may be used as a factor for tuning color coordinates since it is disposed at about 540 nm and has relatively high visibility.

Although not limited thereto, in a light emission spectrum of the first light-controlling part 51", a wavelength of the first peak ⓐ may be in the range of 610 nm to 640 nm, and a wavelength of the second peak ⓑ may be in the range of 520 nm to 600 nm, or 525 nm to 580 nm. In some example embodiments, the first light-controlling part 51" may further include a green phosphor, the same as the green phosphor P2 of the second light-controlling part 52". In this case, a content of the green phosphor of the first light-controlling part 51" may be lower than the content of the green phosphor P2 of the second light-controlling part 52".

A third light-controlling part 53" according to the example embodiment may further include a blue phosphor P3 converting ultraviolet light into blue light (that is, a main peak), and a second tuning wavelength-converting material PT2 providing light within a visible light band (that is, a sub-peak) different from the blue light. For example, the second tuning wavelength-converting material PT2 may be a bluish green, green, yellow, yellowish red, or red phosphor. The light emitted from the third light-controlling part 53" may have a light emission spectrum including a main peak disposed in a blue wavelength band and a sub-peak disposed within another visible light band (e.g., a red or green band such as a sub-peak wavelength greater than 600 nm or between 500 nm or 600 nm) different from the main peak.

Figure 11:
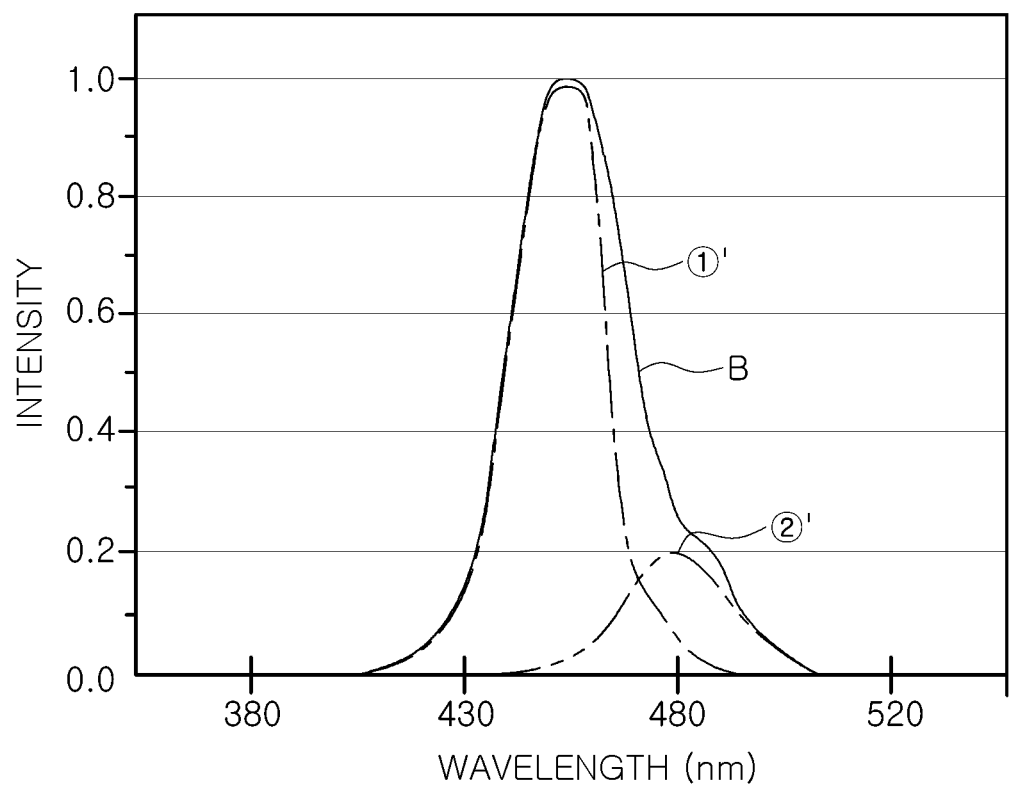
FIG. 11 illustrates a light emission spectrum of a third light-adjusting part (blue) in a light source module according to an example embodiment.

Even when the spectrum of the light B emitted from the third light-controlling part 53" doesn't have two peaks, a profile of a portion thereof may be changed using the tuning wavelength-converting material PT2. As illustrated in FIG. 11, a main peak 1' of a blue phosphor P3 may be disposed in the range of 440 nm to 460 nm, and a sub-peak 2' of the second tuning wavelength-converting material PT2 may be a bluish green wavelength of about 480 nm although different from the main peak wavelength. Under such conditions, the spectrum of light emitted from the third light-controlling part 53" (shown as B in FIG. 11) may only have a main peak, unlike the spectrum of the blue sub-pixel illustrated in FIG. 5. In such a manner, the sub-peak 2' of light intensity associated with just the second tuning wavelength-converting material PT2 may change the profile of the portion of the spectrum to adjust the color coordinates.

In other words, the color coordinates of the light emitted from the third light-controlling part 53" may be tuned in such a manner that the profile of the portion of the spectrum is changed by adjusting a content of the second tuning wavelength-converting material PT2.

The above-described method of tuning the color coordinates may include adding or subtracting the light-absorbing material absorbing the light of the second peak wavelength as well as adjusting the content of the first and second tuning wavelength-converting materials PT1 and PT2, the sub-peak (that is, the second peak 2' may be lowered or increased and the color coordinates may be effectively tuned.

According to the example embodiment, unlike the previous embodiment, not only the blue color coordinates but also red color coordinates may be independently tuned in the manufacturing process of the LED light source module 50". In addition, color coordinates of the second light-controlling part 52" may also be tuned by adding a tuning wavelength-converting material. In addition, similar to the first light-controlling part 51" according to the example embodiment, the red color coordinates, as well as the blue color coordinates, may be independently tuned by changing the first wavelength-converting part 51a of the light source module 50 illustrated in FIG. 4.

According to the example embodiment, the first to third light-controlling parts 51", 52", and 53" are illustrated to only be included with the wavelength-converting parts. However, a light-filtering layer may be additionally disposed on the wavelength-converting parts, similar to the first and second light-controlling parts 51 and 52 illustrated in FIGS. 4 and 8. The light-filtering layer may not only be used to block ultraviolet light but also to narrow a full width at half maximum (FWHM) of emitted light by absorbing a portion of a wavelength band of converted light.

The LED light source module according to the example embodiment may be implemented to have various layouts. Such various layouts are illustrated in FIGS. 12A and 12B and FIGS. 13A and 13B.

Figure 12A:
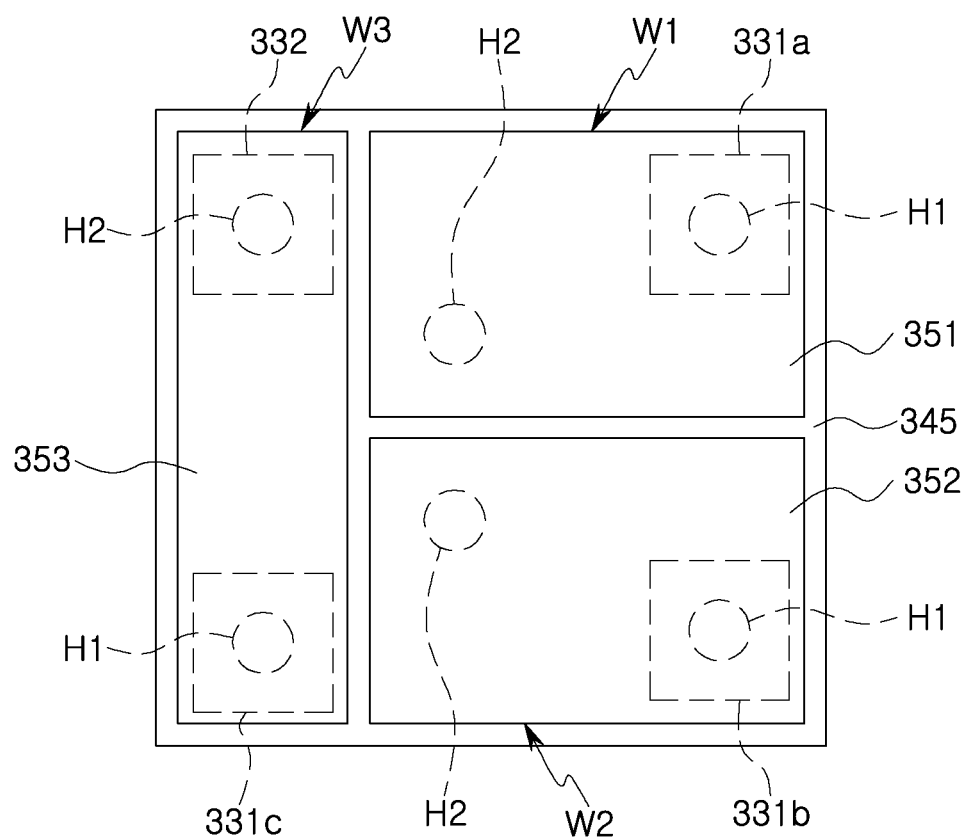
FIGS. 12A and 12B are respectively a plan view and a bottom plan view illustrating a light source module according to an example embodiment.
Figure 12B:
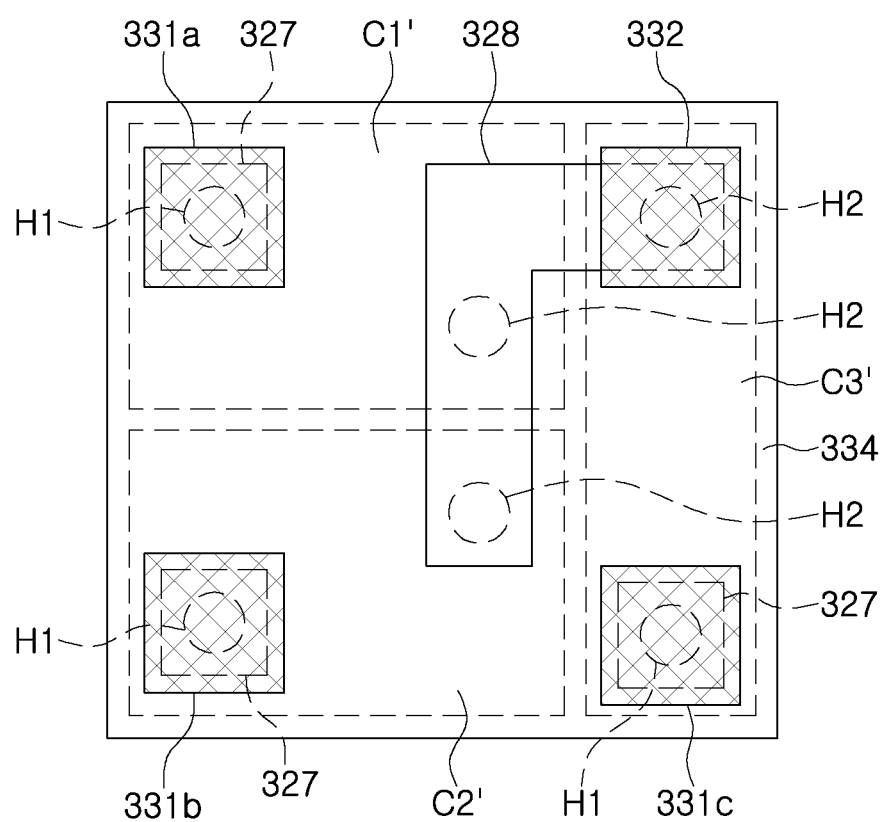

First, referring to FIGS. 12A and 12B, an LED light source module 350 may be understood to have a similar structure to the LED light source module 50 illustrated in FIGS. 1 and 2, except that the arrangement of first to third LED cells C1', C2', and C3' and electrode pads are different therefrom. Components of the LED light source module 350 according to the example embodiment may be understood with reference to the descriptions of similar or the same components of the LED light source module 50 illustrated in FIGS. 1 to 4, unless otherwise specified.

As illustrated in FIGS. 12A and 12B, the LED light source module 350 according to the example embodiment of the present inventive concept may include the first to third LED cells C1', C2', and C3' having different arrangements. The third LED cell C3' may be disposed along the entire one side of the LED light source module 350, and the first and second LED cells C1' and C2' may be disposed in parallel to face a longer side of the third LED cell C3'.

The LED light source module 350 illustrated in FIG. 12B may include three first electrode pads 331a, 331b, and 331c, respectively connected to the three cells C1', C2', and C3', and a second electrode pad 332 commonly connected to the three cells C C2', and C3', like the above-described example embodiment.

The three first electrode pads 331a, 331b, and 331c may be respectively connected to first conductivity-type semiconductor layers of the first to third LED cells C1', C2', and C3' by three first connection electrodes 327. The second electrode pad 332 may be commonly connected to the second conductivity-type semiconductor layers of the first to third LED cells C1', C2', and C3' by a single second connection electrode 328. The first connection electrodes 327 and the second connection electrode 328 may be respectively connected to the conductivity-type semiconductor layers through first and second through-holes H1 and H2. Since the three LED cells C1', C2', and C3' according to the example embodiment are disposed to be adjacent to each other, the second connection electrode 328 as a common electrode may be formed to have a relatively small length compared to that of the example embodiment illustrated in FIG. 2.

Like the above-described embodiment, at least one of first to third light-controlling parts 351, 352, and 353 according to the example embodiment may include a tuning wavelength-converting material providing light having a sub-peak wavelength different from a main peak wavelength of the adjusted light, such as described herein.

Figure 13A:
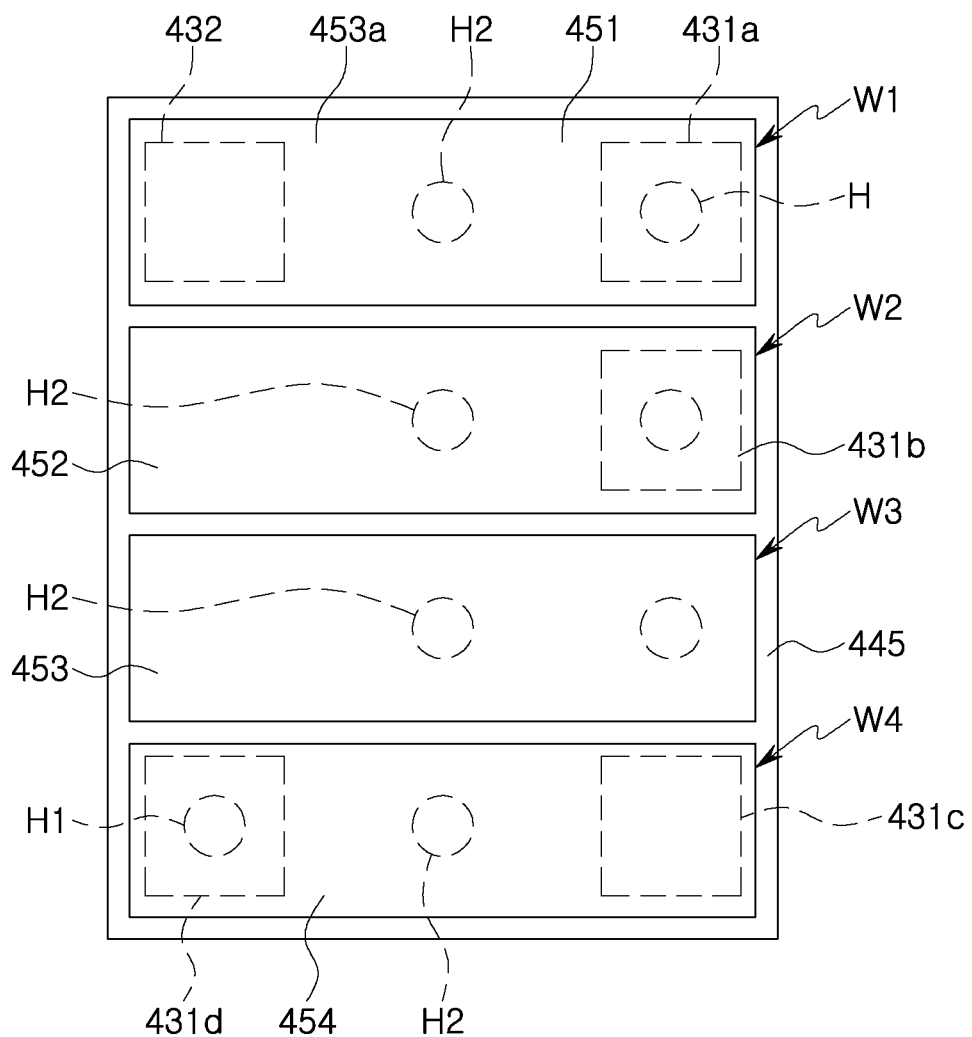
FIGS. 13A and 13B are respectively a plan view and a bottom plan view illustrating a light source module according to an example embodiment.
Figure 13B:
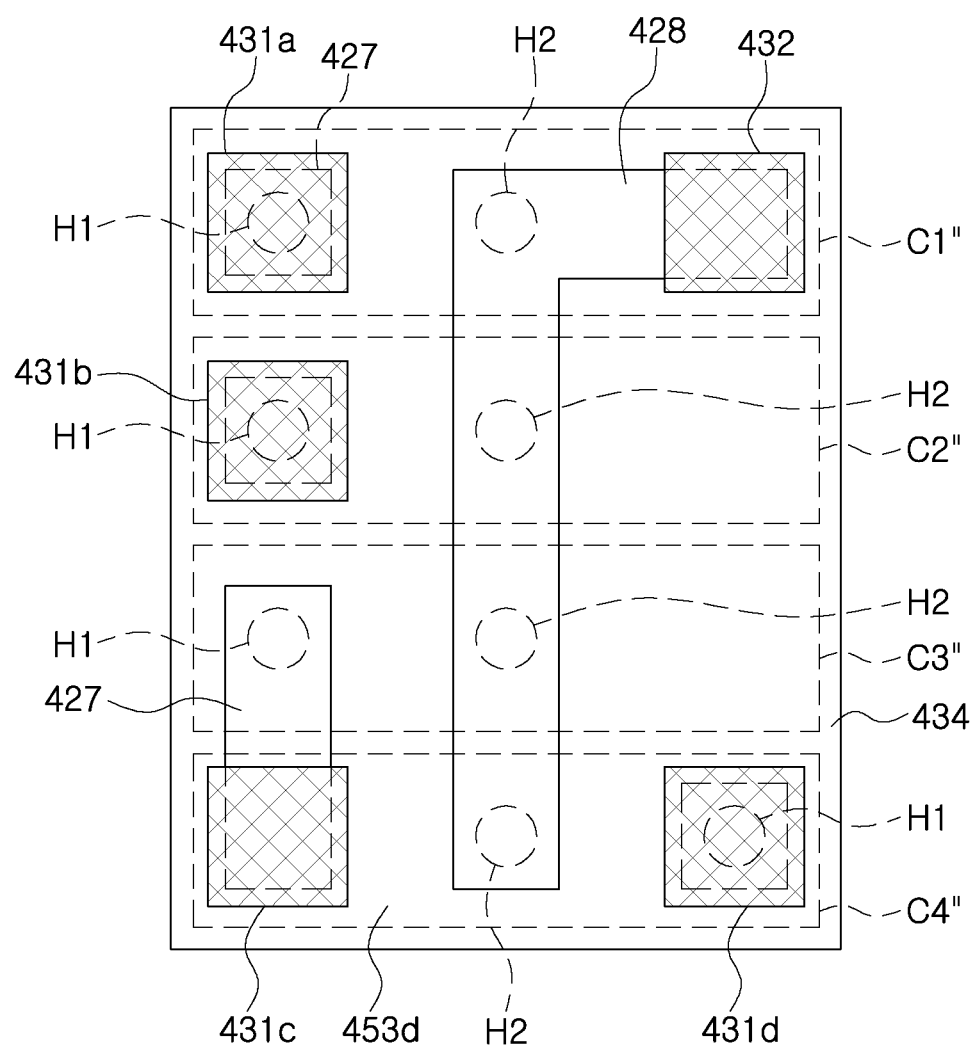

As illustrated in FIGS. 13A and 13B, an LED light source module 450 according to an example embodiment of the present inventive concept may be understood to have a similar structure to the LED light source module 50 illustrated in FIGS. 1 and 2, except that the LED light source module 450 includes four LED cells C1", C2", C3", and C4". Components of the LED light source module 450 according to the example embodiment may be understood with reference to the descriptions of similar or the same components of the LED light source module 50 illustrated in FIGS. 1 to 4, unless otherwise specified.

As illustrated FIG. 13B, the first to fourth LED cells C1", C2", C3", and C4" may be arranged in parallel. In addition, the LED light source module 450 may include four first electrode pads 431a, 431b, 431c, and 431d respectively connected to the four LED cells C1", C2", C3", and C4", and a second electrode pad 432 commonly connected to the four LED cells C1", C2", C3", and C4".

The four first electrode pads 431a, 431b, 431c, and 431d may be respectively connected to first conductivity-type semiconductor layers of the first to fourth LED cells C1", C2", C3", and C4" by four first connection electrodes 427. The second electrode pad 432 may be commonly connected to second conductivity-type semiconductor layers of the first to fourth LED cells C1", C2", C3", and C4" by a single second connection electrode 428. The first and second connection electrodes 427 and 428 may be respectively connected to the first and second conductivity-type semiconductor layers via first and second through-holes H1 and H2. Like the above-described embodiment, at least one of first to fourth light-controlling parts 451, 452, 453, and 454 according to the example embodiment may include a tuning wavelength-converting material providing light having a sub-peak wavelength different from a main peak wavelength of adjusted light.

Figure 14:
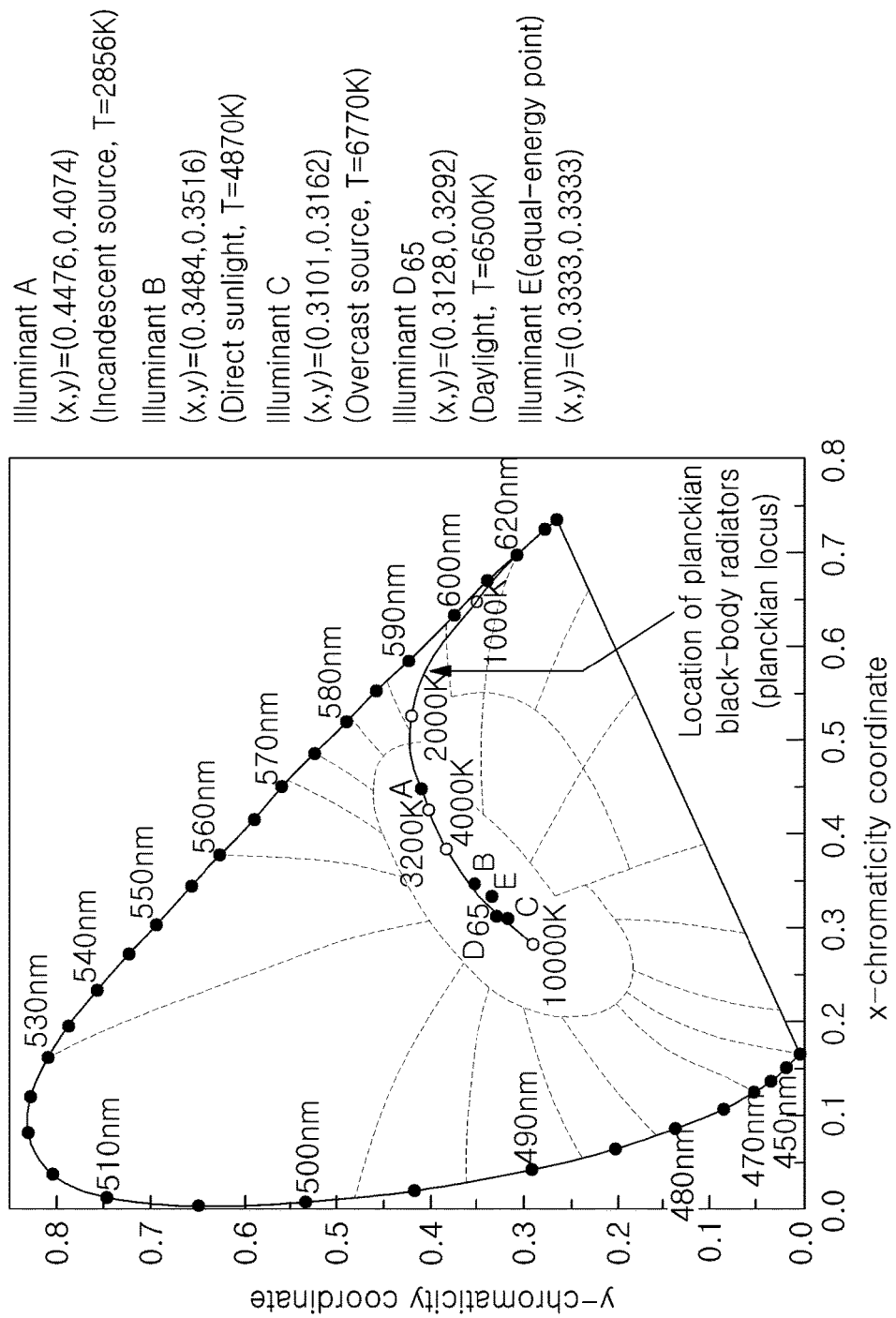
FIG. 14 is a CIE 1931 color space chromaticity diagram provided to illustrate a wavelength-converting material of a light source module according to an example embodiment.

FIG. 14 is a CIE 1931 color space chromaticity diagram provided to illustrate a wavelength-converting material of a light source module according to an example embodiment of the present inventive concept. As will recognized, the x coordinate corresponds to red light, the y coordinate corresponds to green light, and a z value (not shown) corresponds to blue light, where x+y+z=1.

Referring to FIG. 14, white light generated by combining yellow, green, and red phosphors with a blue LED, or combining a green LED and a red LED with a blue LED, may have two or more peak wavelengths, and coordinates (x, y) of the white light may be located on the line connecting (0.4476, 0.4074), (0.3484, 0.3516), (0.3101, 0.3162), (0.3128, 0.3292), (0.3333, 0.3333) in the CIE 1931 color space chromaticity diagram. In addition, the white light may be located in a zone surrounded by the line and a blackbody radiation spectrum. The color temperature of the white light may correspond to 2,000 K to 20,000 K. In FIG. 14, white light around the coordinates E (0.3333, 0.3333) located below the blackbody radiation spectrum may be light in which light of a yellow-based component is relatively weak, and may be used as light sources of illuminations giving a more vivid or fresh feeling to the naked eye. Accordingly, illumination products using white light around the coordinates E (0.3333, 0.3333) located below the blackbody radiation spectrum may be usefully applied to lighting devices for shops selling groceries, clothing, or the like. Use of the pixels described herein, including use of the tuning wavelength converting material, may be used to provide the desired white light, such as described above.

As the material for converting a wavelength of light emitted from the LED cell according to the example embodiment, various materials, such as phosphors and/or quantum dots, may be used.

The phosphors may have compositional formulas and colors as follows.

Oxide group: yellow and green $Y_3Al_5O_{12}$:Ce, $Tb_3Al_5O_{12}$:Ce, $Lu_3Al_5O_{12}$:Ce Silicate group: yellow and green $(Ba,Sr)_2SiO_4$:Eu, yellow and orange $(Ba,Sr)_3SiO_5$:Ce Nitride group: green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, and $0 < y \leq 4$)

(wherein, Ln is at least one element selected from the group consisting of a Group IIIa element and a rare earth element, and M is at least one element selected from the group consisting of Ca, Ba, Sr, and Mg)

Fluoride group: KSF-based red $K_2SiF_6$:Mn4+, $K_2TiF_6$:Mn$_4^+$, $NaYF_4$:Mn$_4^+$, $NaGdF_4$:Mn$_4^+$, $K_3SiF_7$:Mn$^{4+}$ The composition of the phosphor may be consistent with stoichiometry, and each element may be substituted with another element within a corresponding group on the periodic table. For example, strontium (Sr) may be substituted with Ba, Ca, Mg, or the like in the alkaline earth (II) group, and Y may be substituted with Tb, Lu, Sc, Gd, or the like in the lanthanide group. In addition, Eu, an activator, may be substituted with Ce, Tb, Pr, Er, Yb, or the like according to a preferred energy level. The activator may be used alone, or a coactivator may be further included in order to change characteristics.

In particular, each fluoride-based red phosphor may be coated with a fluoride without containing Mn, or a surface of the red phosphor or a surface of the fluoride without containing Mn may be further coated with an organic material in order to improve reliability in high temperature/high humidity environments. Unlike other phosphors, such a fluoride-based red phosphor may implement a narrow full width at half maximum (FWHM) of 40 nm or less, and therefore may be used in a high-definition TV such as a UHD TV.

Table 1 below illustrates various types of phosphors that may be used with a light controlling part with an LED chip having LED cells emitting blue light having a dominant wavelength in the range of 440 nm to 460 nm or with a UV LED chip having LED cells emitting UV light having a dominant wavelength in the range of 380 nm to 440 nm, listed by applications.

TABLE 1

| Purpose | Phosphor |
|---|---|
| LED TV BLU | β-SiAlON:$Eu^{2+}$, (Ca, Sr)AlSiN$_3$:$Eu^{2+}$, La$_3$Si$_6$N$_{11}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, and 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Lighting Devices | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, and 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Side Viewing (Mobile, Laptop PCs) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, (Sr, Ba, Ca, Mg)$_2$SiO$_4$:$Eu^{2+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, and 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |
| Electronics (Headlamps, etc.) | Lu$_3$Al$_5$O$_{12}$:$Ce^{3+}$, Ca-α-SiAlON:$Eu^{2+}$, La$_3$Si$_6$N$_{11}$:$Ce^{3+}$, (Ca, Sr)AlSiN$_3$:$Eu^{2+}$, Y$_3$Al$_5$O$_{12}$:$Ce^{3+}$, K$_2$SiF$_6$:$Mn^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, and 0 < y ≤ 4), K$_2$TiF$_6$:$Mn^{4+}$, NaYF$_4$:$Mn^{4+}$, NaGdF$_4$:$Mn^{4+}$, K$_3$SiF$_7$:$Mn^{4+}$ |

The phosphor of the wavelength-converting part may be part of a quantum dot (QD) (i.e., reference herein to the phosphor of the wavelength-converting part of the disclosed embodiments includes such phosphor alone or to quantum dots (QDs) including such phosphor). The quantum dot may have a core-shell structure including Group II-VI or Group III-V compound semiconductors. For example, the quantum dot may have a core such as CdSe or InP and a shell such as ZnS or ZnSe. Also, the quantum dot may include a ligand to stabilize the core and shell. For example, the core may have a diameter ranging from about 1 nm to 30 nm, and preferably, about 3 nm to 10 nm in an example embodiment. The shell may have a thickness ranging from about 0.1 nm to 20 nm, and preferably, about 0.5 nm to 2 nm in an example embodiment. The quantum dots may realize various colors according to their size. The use of quantum dots may be helpful to realize a narrow FWHM (e.g., 35 nm or less) of the converted light of the light converting part of the sub-pixel.

The LED light source module according to the example embodiment may be usefully applied to a display panel.

Figure 15:
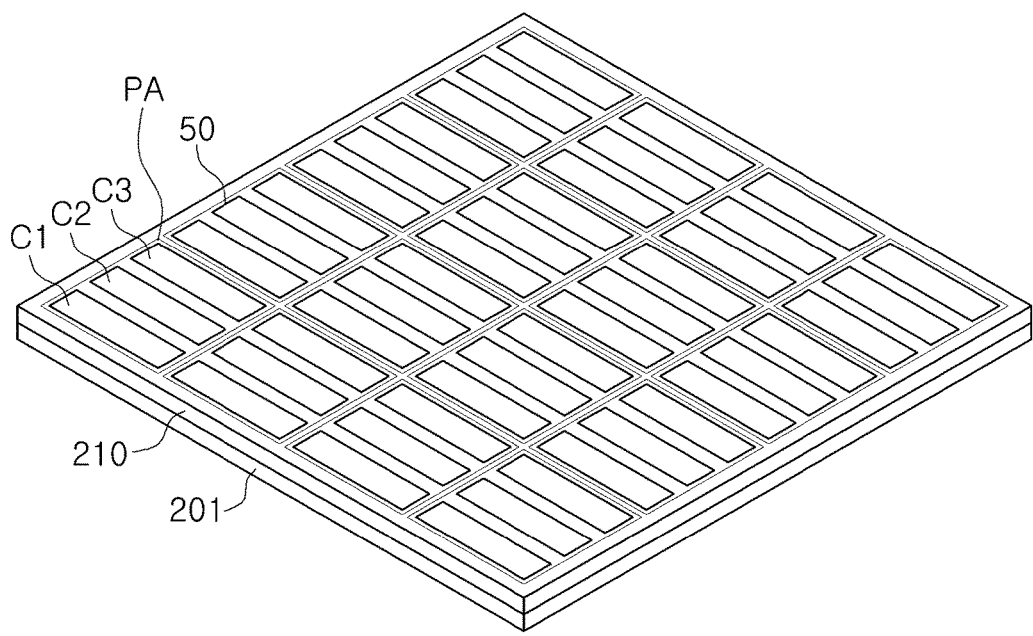
FIG. 15 is a schematic perspective view of a display panel including the light source module illustrated in FIG. 1.
Figure 16:
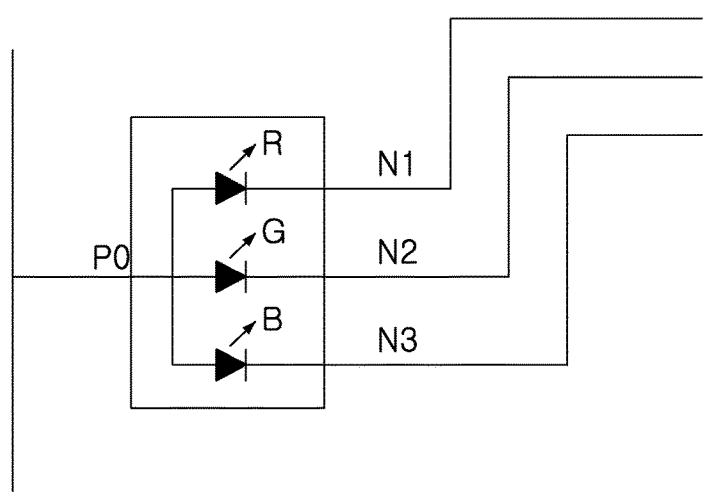
FIG. 16 illustrates an example of a circuit configuration of a pixel area of the display panel illustrated in FIG. 15.

FIG. 15 is a schematic perspective view of a display panel including the light source module 50 illustrated in FIG. 1, and FIG. 16 illustrates an example of a circuit configuration of a pixel area PA of the display panel illustrated in FIG. 15.

A display panel 200 illustrated in FIG. 15 may include a circuit board 201 and a plurality of LED light source modules 50 disposed on the circuit board 201. The display panel 200 may further include a matrix 210 disposed on the circuit board 201. The matrix 210 may function as a guide line defining a mounting area of the plurality of LED light source modules 50. The matrix 210 may be a black matrix which is both opaque and light absorbing. Other colored matrices, such as a white matrix or a green matrix, may be used depending on purposes or uses of the products. A matrix formed of a transparent material may also be used as the matrix 210, as desired. The white matrix may further include a reflective material or a light scattering material.

The matrix 210 may include at least one material, such as a polymer, containing a resin, a ceramic, a semiconductor, and a metal.

The plurality of LED light source modules 50 may provide a pixel PA including red (R), green (G), and blue (B) sub-pixels. Such a pixel PA may be consecutively arranged. Each of the sub-pixels may include a combination of an LED cell and a light-controlling part, as illustrated in FIGS. 1 to 4. According to the example embodiment, the three sub-pixels R, G, and B may be arranged side by side in a single direction in a single pixel PA. The three sub-pixels R, G, and B may be variously arranged as necessary.

Such an arrangement may be variously changed by varying the arrangement of the LED cells in the LED light source modules 50, as the example embodiments illustrated in FIGS. 12A and 12B and FIGS. 13A and 13B. The circuit board 201 may include a circuit configured to independently drive the R, G, and B sub-pixels of each pixel. For example, the circuit board 201 may be a thin-film transistor (TFT) substrate including a matrix of TFTs, with each TFT activated by a row line connected to its gate to selectively provide a voltage from a data line (e.g., connected to a first S/D (source drain) of the TFT) to a pixel PA (to which a second S/D (source/drain) of the TFT is connected).

FIG. 16 illustrates an example of a circuit configuration of a pixel area PA of the display panel 200 illustrated in FIG. 15. Here, the R, G, and B may be understood as each LED cell configuring a sub-pixel of the LED light source module 50 in FIG. 14.

Each LED R, G, and B configuring the sub-pixel may have various configurations for circuit connection to be independently driven. For example, as illustrated in FIG. 16, a positive electrode P0 of pixel PA including LED sub-pixels R, G, and B may be connected to a drain of a P-MOSFET (not shown). The positive electrode P0 may be the second connection electrode 28 connected to a second electrode pad 32 as described herein, e.g. A plurality of pixels PA may connected via other corresponding P-MOSFETs in such a manner to the same row line, and a plurality of row lines may be arranged side-by-side in a column direction having similar connections to other P-MOSFET transistors and pixels PA. Each of negative electrodes N1, N2, and N3 of the LED sub-pixels R, G, and B may have a corresponding current input terminal connected to a different column line (e.g., that extends across the pixel array in a direction perpendicular to the row lines). Each of the negative electrodes N1, N2 and N3 may be a different first connection electrode 27, each connected to a different one of the electrode pads 31a, 31b and 31c (as described herein) acting as a current input terminal of the sub-pixel, which is in turn connected to a different column line. In some examples, each of the current input terminals may comprise a constant-current input terminal to receive a constant current from an LED driving circuit. A source of the P-MOSFET may be connected to a power supply terminal supplying a constant positive voltage, and a gate of the P-MOSFET may be connected to a control input of a row power supply (e.g., a row line as described herein). A controller may selectively turn on a P-MOSFET by providing an appropriate positive gate voltage to the P-MOSFET (via the control input) to supply power to the positive electrode of each LED R, G, and B of each pixel of the row, and at the same time, an output of a constant-current control signal from the controller may control a corresponding LED driving circuit connected to a column line to cause a selected constant current to be obtained on each column line. Accordingly, the LED to which the power is supplied may be turned on.

Figure 17:
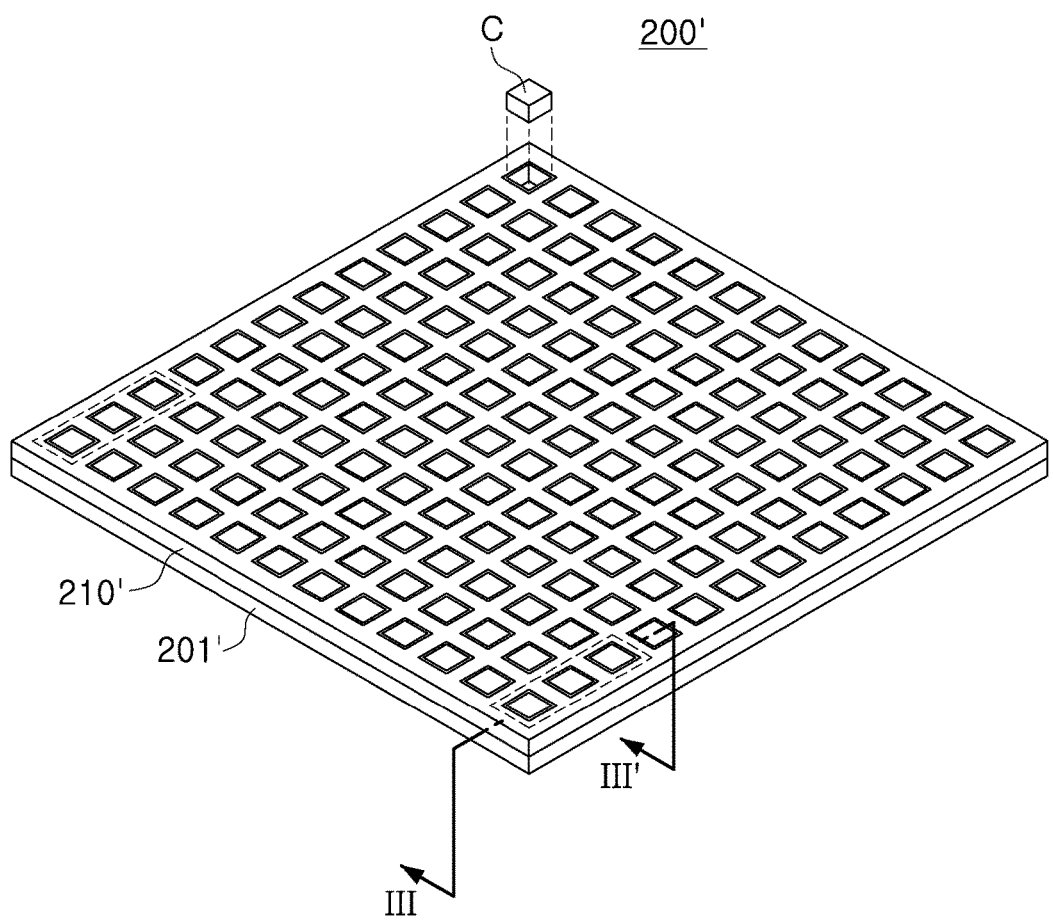
FIG. 17 is a schematic perspective view illustrating a display panel according to an example embodiment.
Figure 18:
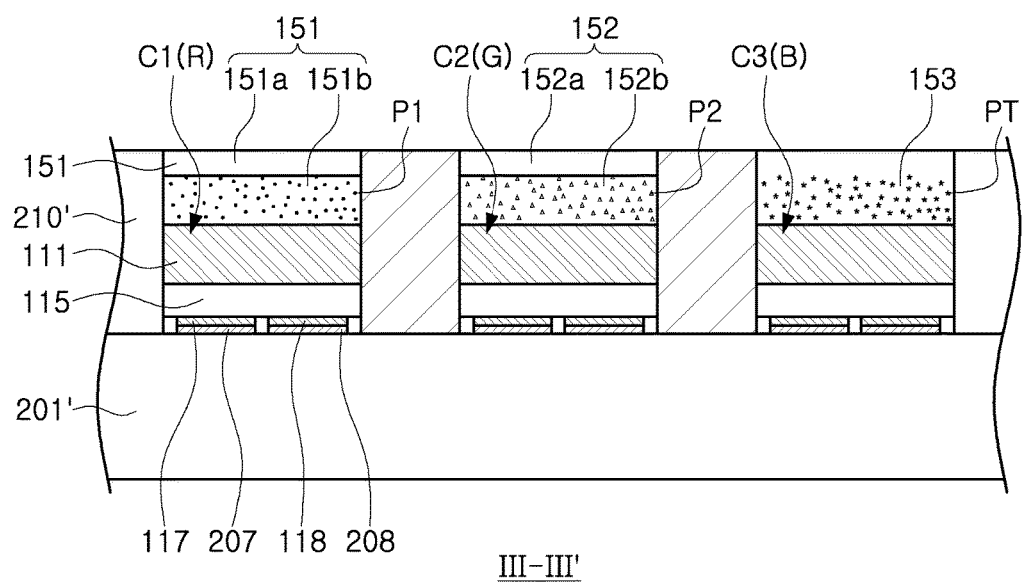
FIG. 18 is a side cross-sectional view taken from a pixel area of the display panel illustrated in FIG. 17.

Although the exemplary LED light source module described above is formed of plural pixels PA mounted on a circuit board, where each pixel PA (including a plurality of sub-pixels) is formed as a single semiconductor chip packaged in a single chip scale package (CSP) and mounted on a circuit board, alternatively, each single semiconductor chip may comprise a plurality of pixels PA (each pixel PA including plural sub-pixels, such as R, G, B as describe herein) or an independent LED chip may be used for each sub-pixel which are then mounted on a circuit board (please refer to FIGS. 17 and 18).

FIG. 17 is a schematic perspective view of a display panel according to an example embodiment of the present inventive concept.

A display panel 200' illustrated in FIG. 17 may include a circuit board 201' and a plurality of LED chips C disposed on the circuit board 201'. The display panel 200' may include a matrix 210' (e.g., a black matrix, a white matrix, a colored matrix or a transparent matrix), disposed on the circuit board 201'. Although not limited thereto, the matrix 210' may be previously formed on the circuit board 201' to be used as a guide for guiding the LED chips C to a precise location during a mounting process of the LED chips C. In addition, the matrix 210' may be a black matrix and function to prevent leakage of light from the LED chips C configuring a sub-pixel R, G, and B and may include a metal compound such as CrO, or a metal such as Cr.

FIG. 18 is a side cross-sectional view taken along line of a pixel area of the display panel illustrated in FIG. 17. Here, the LED chips C illustrated in FIG. 17 may each form only a single sub-pixel R, G, or B, and may comprise similar structure to (e.g., same material layers) the LED cells C1, C2, and C3 and configured with a respective one of light controlling parts 51, 52 and 53 as described above.

Referring to FIG. 18, the first to third LED cells C1, C2, and C3 may be mounted on the circuit board 201', and first and second electrodes 117 and 118 may be respectively connected to first and second connection pads 207 and 208.

The LED cells C1, C2, and C3 mounted on the circuit board 201' may include a light-transmitting substrate 111 and a semiconductor laminate 115 disposed on the light-transmitting substrate 111. The first to third LED cells C1, C2, and C3 may the structure as the LED chip illustrated in FIG. 19A or may have the structure as the LED chip illustrated in FIG. 19B.

First to third light-controlling parts 151, 152, and 153 of the first to third LED cells C1, C2, and C3 may configure a plurality of sub-pixels including R, G, and B, together with the light-transmitting substrate 111 and the semiconductor laminate 115.

When the first to third LED cells C1, C2, and C3 emit blue light, the first and second light-controlling parts 151 and 152 may include first and second wavelength-converting parts 151a and 152a including red and green phosphors P1 and P2, respectively. The first and second light-controlling parts 151 and 152 may comprise the same materials as the light controlling parts 51 and 52 described elsewhere herein. The first and second light-controlling parts 151 and 152 may further include light-filtering layers 151b and 152b (light filters) respectively disposed on first and second wavelength-converting parts 151a and 152a and selectively blocking blue light.

The third light-controlling part 153 according to the example embodiment may include a tuning wavelength-converting material PT. The third light-controlling part 153 may comprise the same materials as the light controlling part 53 described elsewhere herein. The tuning wavelength-converting material PT may be a phosphor providing light having a different color from the blue light. For example, the tuning wavelength-converting material PT may be a red or green phosphor.

According to the example embodiment, three sub-pixels R, G, and B are arranged side by side in one direction in the pixel area illustrated in FIG. 18, but are not limited thereto. The sub-pixels R, G, and B may be variously arranged as necessary. For example, the sub-pixels R, G, and B may be arranged at respective vertices of a triangle. Although 12 sub-pixels R, G, and B (that is, four pixels) are illustrated to be arranged in both of a vertical direction and a horizontal direction for convenience of description, the number of pixels to be arranged may depend on required resolution (e.g. 1,024×768). The circuit board 201' may include a circuit configured to independently drive the sub-pixels R, G, and B of each pixel (please refer to FIG. 16).

Figure 19A:
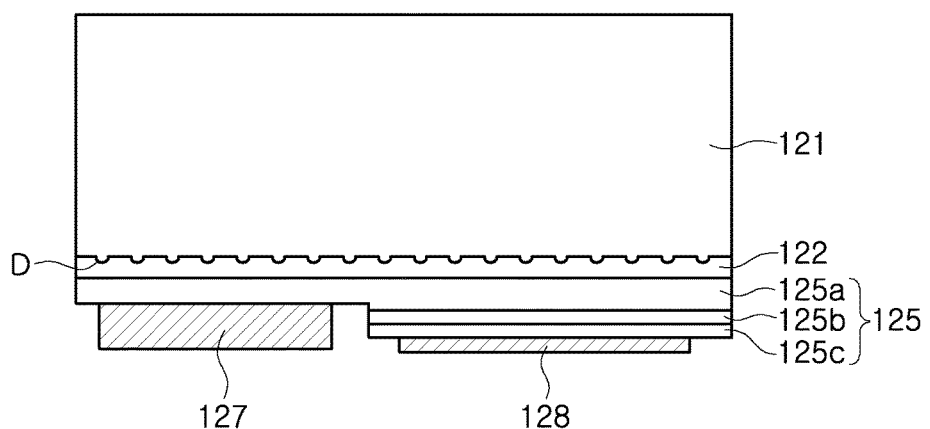
FIGS. 19A and 19B are cross-sectional views illustrating LED chips having various structures according to example embodiments.
Figure 19B:
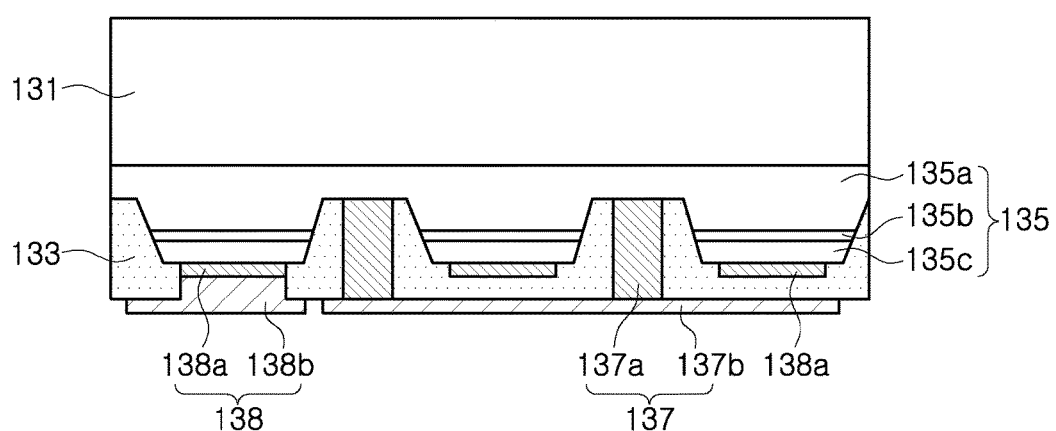

The first, second and third light controlling parts 151, 152 and 153 may be formed on a respective LED cell when such LED cell is being manufactured and part of a wafer comprising a plurality of LED cells (e.g., as described herein). Alternatively, each of the first, second and third light controlling parts 151, 152 and 153 may be formed on a respective LED cell of the display panel after the LED cells have been mounted on the circuit board 201'. Specifically, during the assembly of the display panel, the first to third LED cells may be mounted on the circuit board 201' and driven by circuit board 201' wiring (e.g. as described with respect to FIGS. 15 and 16) to emit light. Such light may be measured and used to determine the contents (e.g., amount of tuning wavelength-converting material LT, an amount of light absorbing material LA and/or an amount of primary tuning wavelength converting material) of one or more of the first, second and third light controlling parts 151, 152 and 153 (e.g., as described herein with respect to light controlling parts 51, 52 and 53). A liquid resin with such determined content may then be deposited within a cavity formed by the matrix 210' over the appropriate LED cell C1, C2 or C3. In addition to the LED chips of the above-described example embodiments, LED chips according to example embodiments may have various structures. FIGS. 19A and 19B are cross-sectional views illustrating LED chips having various structures according to example embodiments of the present inventive concept.

An LED chip 120 illustrated in FIG. 19A may include a light-transmitting substrate 121 and a semiconductor laminate 125 disposed on the light-transmitting substrate 121.

The light-transmitting substrate 121 may be an insulating substrate such as sapphire, but is not limited thereto. The light-transmitting substrate 121 may be a conductive or semiconductive substrate securing light transmitting properties, other than the insulating substrate. An unevenness pattern D may be formed on an upper surface of the light-transmitting substrate 121. The unevenness pattern D may increase light extraction efficiency, and may improve quality of a single crystal being grown on the light-transmitting substrate 121.

The semiconductor laminate 125 may include a first conductivity-type semiconductor layer 125a, an active layer 125b, and a second conductivity-type semiconductor layer 125c. A buffer layer 122 may be disposed between the light-transmitting substrate 121 and the first conductivity-type semiconductor layer 125a.

The buffer layer 122 may include $In_xAl_yGa_{1-x-y}N$ ($0 \leq x \leq 1$ and $0 \leq y \leq 1$). For example, the buffer layer 122 may include GaN, AlN, AlGaN, or InGaN. As necessary, the buffer layer 122 may be formed by combining a plurality of layers or gradually changing compositions thereof.

The first conductivity-type semiconductor layer 125a may be a nitride semiconductor layer satisfying a composition of n-type $In_xAl_yGa_{1-x-y}N$ (0≤x<1, 0≤y<1, and 0≤x+y<1), and n-type impurities thereof may be Si. For example, the first conductivity-type semiconductor layer 125a may include n-type GaN. The second conductivity-type semiconductor layer 125c may be a nitride semiconductor layer satisfying a composition of p-type $In_xAl_yGa_{1-x-y}N$ (0≤x<1, 0≤y<1, and 0≤x+y<1), and p-type impurities thereof may be Mg. For example, the second conductivity-type semiconductor layer 125c may be implemented as a single layer structure, but as in the example embodiment, may have a multilayer structure having different compositions. The active layer 125b may have a multiple quantum well (MQW) structure in which quantum well layers and quantum barrier layers are alternately stacked. For example, the quantum well layers and the quantum barrier layers may include different compositions of $In_xAl_yGa_{1-x-y}N$ (0≤x≤1, 0≤y≤1, and 0≤x+y≤1), respectively. In some example embodiments, the quantum well layers may include a composition of $In_xGa_{1-x}N$ (0<x≤1), and the quantum barrier layers may include GaN or AlGaN. The active layer 125b is not limited to the MQW structure, and may have a single quantum well (SQW) structure.

A first electrode 127 and a second electrode 128 may be disposed on a mesa-etched region of the first conductivity-type semiconductor layer 125a, and the second conductivity-type semiconductor layer 125c, respectively, to be positioned on the same side (a first surface). For example, the first electrode 127 may contain at least one of Al, Au, Cr, Ni, Ti, and Sn. The second electrode 128 may be formed of a reflective metal. For example, the second electrode 128 may contain a material, such as Ag, Ni, Al, Cr, Rh, Pd, Ir, Ru, Mg, Zn, Pt, or Au, and may have a structure of a single layer or two or more layers.

An LED chip 130 illustrated in FIG. 19B may include a semiconductor laminate 135 disposed on a surface of a light-transmitting substrate 131. The semiconductor laminate 135 may include a first conductivity-type semiconductor layer 135a, an active layer 135b, and a second conductivity-type semiconductor layer 135c.

The LED chip 130 may include a first electrode 137 and a second electrode 138 respectively connected to the first conductivity-type semiconductor layer 135a and the second conductivity-type semiconductor layer 135c. The first electrode 137 may include a connection electrode 137a, such as conductive vias, passing through the second conductivity-type semiconductor layer 135c and the active layer 135b to be connected to the first conductivity-type semiconductor layer 135a, and a first electrode pad 137b connected to the connection electrode 137a.

The connection electrode 137a may be surrounded by an insulating layer 133 to be electrically isolated from the active layer 135b and the second conductivity-type semiconductor layer 135c. The connection electrode 137a may be disposed on an area on which the semiconductor laminate 135 is etched. The connection electrode 137a may be properly designed in terms of number, shape, pitch, or contact area with the first conductivity-type semiconductor layer 135a to reduce contact resistance. In addition, the connection electrode 137a may be arranged to form rows and columns on the semiconductor laminate 135 to improve a current flow. The second electrode 138 may include an ohmic contact layer 138a disposed on the second conductivity-type semiconductor layer 135c and a second electrode pad 138b disposed on the second conductivity-type semiconductor layer 135c.

The connection electrode 137a and the ohmic contact layer 138a may include a conductive material having a single layer or multilayer structure so as to respectively form ohmic contacts with the first and second conductivity-type semiconductor layers 135a and 135b. For example, the connection electrode 137a and the ohmic contact layer 138a may be formed using a process of depositing or sputtering at least one of materials such as Ag, Al, Ni, Cr, or a transparent conductive oxide (TCO). The first and second electrode pads 137b and 138b may be respectively connected to the connection electrode 137a and the ohmic contact layer 138a to function as external terminals of the LED chip 130. For example, the first and second electrode pads 137b and 138b may include Au, Ag, Al, Ti, W, Cu, Sn, Ni, Pt, Cr, NiSn, TiW, AuSn, or a eutectic metal thereof. The insulating layer 133 may include, for example, silicon oxide and silicon nitride such as $SiO_2$, $SiO_xN_y$, and $Si_xN_y$. The insulating layer 133 may be formed by dispersing light-reflective fillers in a light transmitting material, or introducing a DBR structure in order to secure a high level of reflectance.

Figure 20:
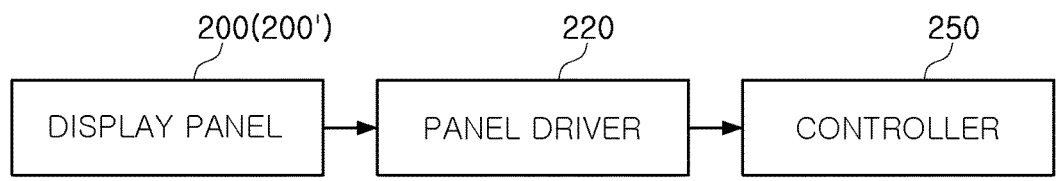
FIG. 20 is a block diagram illustrating a configuration of a display device according to an example embodiment.

FIG. 20 is a block diagram illustrating a configuration of a display device according to an example embodiment of the present inventive concept.

Referring to FIG. 20, the display panel 200 or 200' illustrated in FIGS. 15 and 17 may be part of a display device along with a panel-driving circuit 220 and a controller 250. Here, the display device may be implemented as a display of various electronic devices, such as a TV, an electronic blackboard, an electronic table, a large format display (LFD), a smartphone, a tablet PC, a desktop PC, a laptop PC or the like.

The panel-driving circuit 220 may drive the display panel 200 or 200', and the controller 250 may control the panel-driving circuit 220. The panel-driving circuit 220 controlled by the controller 250 may comprise one or more semiconductor chips (e.g., display driver chips) having control inputs to receive control information from the controller, and having outputs which provide voltages (responsive to the control information) to independently turn each of the plurality of sub-pixels including red (R), green (G), and blue (B) on or off.

For example, the panel-driving circuit 220 may transmit a clock signal having a specific driving frequency to each of the plurality of sub-pixels to turn each of the plurality of sub-pixels on or off. The controller 250 may control the panel-driving circuit 220 to turn the plurality of sub-pixels on in groups (e.g., predetermined groups that are sequentially activated and driven over a frame of a video image, such as row by row of sub-pixels or row by row of pixels) in response to an input image signal, thereby displaying a required image on the display panel 200 or 200'.

Figure 21:
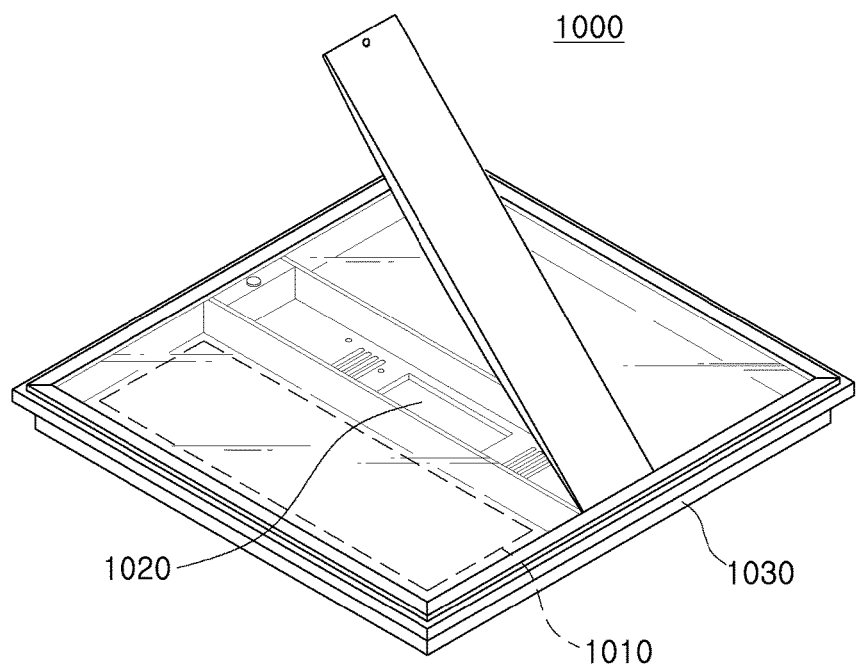
FIG. 21 is a perspective view of a flat lighting device in which a light source module according to an example embodiment may be employed.

FIG. 21 is a perspective view of a flat lighting device in which a light source module according to an example embodiment of the present inventive concept may be employed.

Referring to FIG. 21, a flat lighting device 1000 may include a light source module 1010, a power supply 1020, and a case 1130. According to the example embodiment, the light source module 1010 may be one of the LED light source modules according the above-described example embodiments. The power supply 1020 may include a light source module driver.

The light source module 1010 may have an overall flat shape. According to an example embodiment, the light source module 1010 may include a plurality of semiconductor light-emitting devices and a controller storing driving information of the semiconductor light-emitting devices.

The power supply 1020 may be configured to supply power to the light source module 1010. The case 1030 may have a space so that the light source module 1010 and the power supply 1020 are accommodated therein. The case 1030 may have a hexahedral shape with an open side, but is not limited thereto. The light source module 1010 may be disposed to emit light to the open side of the case 1030.

Figure 22:
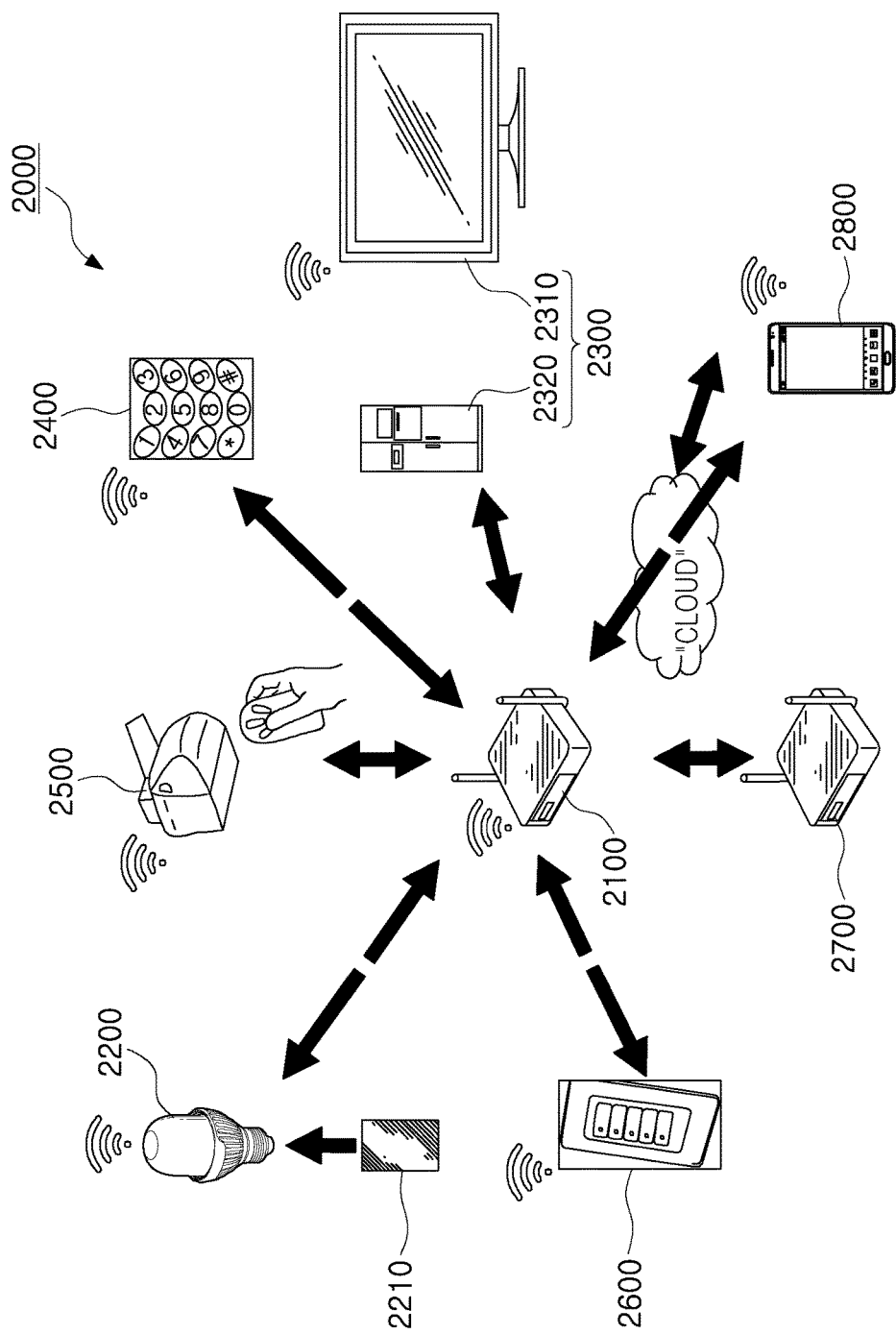
FIG. 22 illustrates an indoor lighting control network system in which a light source module according to an example embodiment may be employed.

FIG. 22 illustrates an indoor lighting control network system in which a light source module according to an example embodiment of the present inventive concept may be employed.

A network system 2000 according to an example embodiment may be a complex smart lighting-network system in which lighting technology using a semiconductor light emitting device such as an LED is combined with Internet of Things (IoT) technology, wireless communications technology, and the like. The network system 2000 may be implemented using a variety of lighting devices and wired/wireless communications devices, and may be realized by a sensor, a controller, a communications device, software for network control and maintenance, and the like.

The network system 2000 may be utilized in an open space such as a park or a street, as well as to a closed space defined within a building, such as a home or an office. The network system 2000 may be implemented on the basis of an IoT environment so as to collect and process various pieces of information and provide the collected and processed information to a user. In this case, an LED lamp 2200 included in the network system 2000 may include the light source module illustrated in FIG. 1. The LED lamp 2200 may function to not only control the illumination thereof by receiving information regarding a surrounding environment from a gateway 2100, but also check and control operational states of other devices 2300 to 2800 belonging to the IoT environment based on a function of the LED lamp 2200 such as visible light communications.

Referring to FIG. 22, the network system 2000 may include the gateway 2100 processing data transmitted and received over different communications protocols, the LED lamp 2200 connected to the gateway 2100 to communicate therewith and including an LED as a light source, and the plurality of devices 2300 to 2800 connected to the gateway 2100 to communicate therewith according to various wireless communications schemes. In order to implement the network system 2000 on the basis of the IoT environment, the LED lamp 2200 and the respective devices 2300 to 2800 may include at least one communications module. In some example embodiments, the LED lamp 2200 may be connected to the gateway 2100 to communicate therewith over wireless communications protocols, such as Wi-Fi, Zigbee®, and light fidelity (Li-Fi). In this regard, the LED lamp 2200 may include at least one lamp communications module 2210, and to this end, the LED lamp 2200 may have at least one lamp communications module 2210.

As described above, the network system 2000 may be utilized in an open space such as a park or a street, as well as to a closed space defined within a building, such as a home or an office. When the network system 2000 is utilized at a home, the plurality of devices 2300 to 2800 belonging to the network system 2000 and connected to the gateway 2100 to communicate therewith on the basis of IoT technology, may include household appliance 2300, a digital door lock 2400, a garage door lock 2500, a lighting switch 2600 installed on a wall or the like, a router 2700 for wireless network relay, and a mobile device 2800, such as a smartphone, a tablet PC, or a laptop PC.

In the network system 2000, the LED lamp 2200 may check the operating states of the various devices 2300 to 2800, or may automatically control the intensity of the LED lamp 2200 itself according to surrounding environment/conditions, using a wireless communications network (e.g. Zigbee®, Wi-Fi, or Li-Fi) installed in a home. In addition, the LED lamp 2200 may control the devices 2300 to 2800 belonging to the network system 2000 by using LiFi communications using visible light emitted from the LED lamp 2200.

First, the LED lamp 2200 may automatically control the intensity thereof on the basis of information regarding surroundings transmitted from the gateway 2100 through the lamp communications module 2210, or information regarding circumstances collected by a sensor installed in the LED lamp 2200. For example, brightness of the LED lamp 2200 may be automatically controlled according to a type of a program being broadcast on a television 2310 or brightness of a screen. In this regard, the LED lamp 2200 may receive operational information of the television 2310 from the lamp communications module 2210 connected to the gateway 2100. The lamp communications module 2210 may be integrally modularized with a sensor and/or a controller included in the LED lamp 2200.

For example, when a program being broadcast to the television 2310 is a drama, a color temperature of the LED lamp 2200 may be lowered to 12,000 K or less (e.g. 6,000 K) according to a preset value, and color tones of the LED lamp 2200 may be adjusted to produce a cozy atmosphere. On the contrary, when the program is a comedy, the network system 2000 may be configured to increase the color temperature of the LED lamp 2200 to 6,000K or more according to a preset value and adjust the LED lamp 2200 to emit blue-based white light.

In addition, when a period of time has elapsed after the digital door lock 2400 is locked in the absence of a person at home, all of turned-on LED lamps 2200 may be turned off to prevent power wastage. In addition, when the digital door lock 2400 is locked in the absence of a person at home after a security mode is set through the mobile apparatus 2800, the LED lamp 2200 may be maintained in a turned-on state.

Operations of the LED lamp 2200 may also be controlled according to information regarding circumstances collected by various types of sensors connected to the network system 2000. For example, when the network system 2000 is implemented in a building, a light, a location sensor, and a communications module may be combined in the building to turn the light on or off by collecting information about locations of people in the building, or the collected information may be provided in real time to enable facility management or efficient use of idle spaces. Normally, since a lighting device such as the LED lamp 2200 may be placed in every space at each floor in a building, a variety of information may be collected through the sensor provided integrally with the LED lamp 2200, and the collected information may be utilized in the facility management or the use of idle spaces.

Meanwhile, the LED lamp 2200 may be combined with an image sensor, a storage apparatus, the lamp communications module 2210, or the like to be utilized as an apparatus to maintain building security or detect an emergency and respond thereto. For example, when a smoke or temperature sensor is attached to the LED lamp 2200, an outbreak of fire may be quickly detected to minimize damages. Further, the brightness of the lightings may be controlled in consideration of external weather or sunlight to save energy and provide a comfortable lighting environment.

Figure 23:
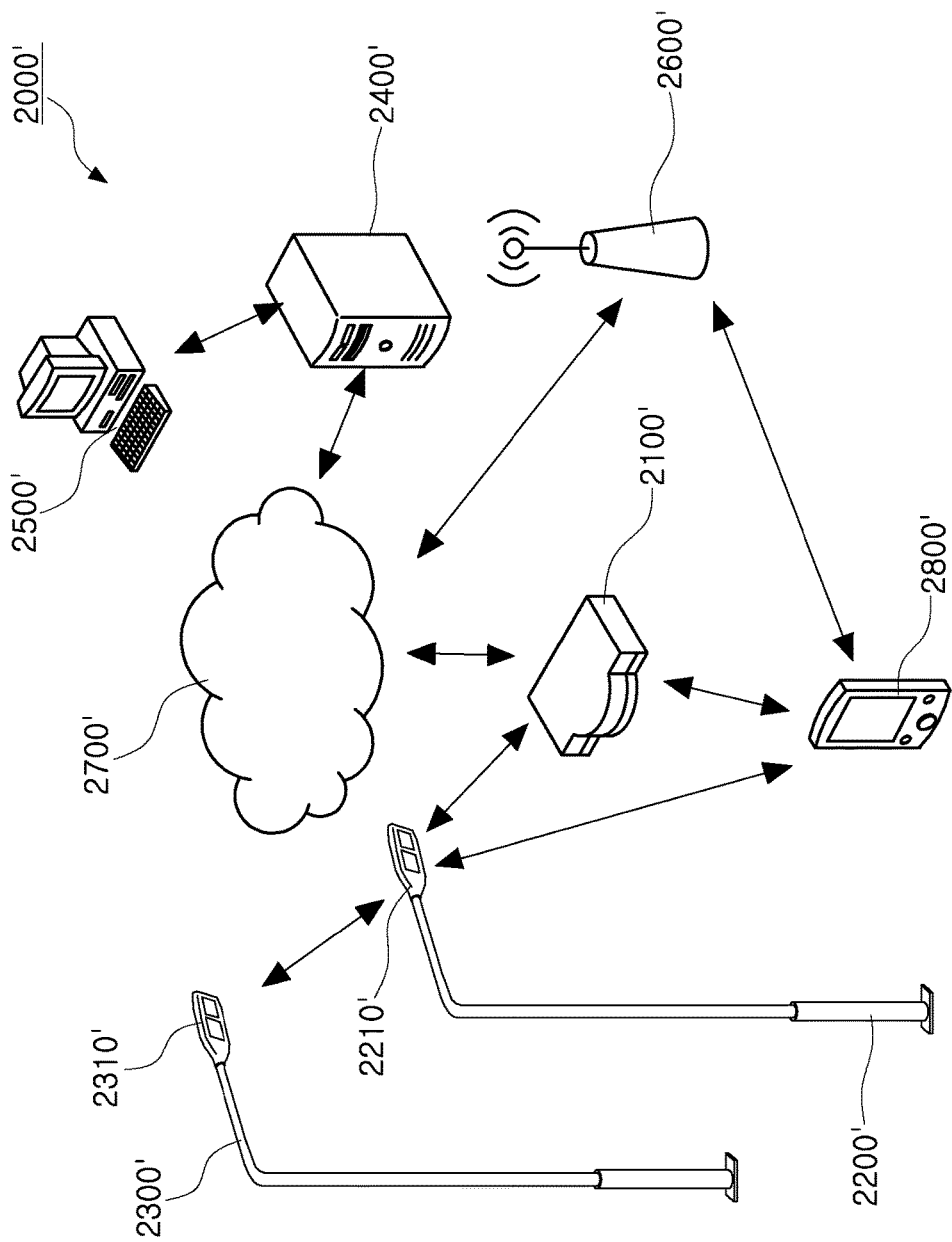
FIG. 23 illustrates an open network system in which a light source module according to an example embodiment may be employed.

FIG. 23 illustrates an open network system in which a light source module according to an example embodiment of the present inventive concept may be employed.

Referring to FIG. 23, a network system 2000' according to an example embodiment may include a communications connection device 2100', a plurality of lighting devices 2200' and 2300' installed at predetermined intervals and connected to the communications connection device 2100' to communicate therewith, a server 2400', a computer 2500' managing the server 2400', a communications base station 2600', a communications network 2700' connecting the above-mentioned communicable devices, a mobile device 2800', and the like.

The plurality of lighting devices 2200' and 2300' installed in an external open space such as a street or a park may include smart engines 2210' and 2310', respectively, along with the light source module illustrated in FIG. 1. Each of the smart engines 2210' and 2310' may include a sensor collecting information regarding surroundings, a communications module, and the like, in addition to a semiconductor light emitting device emitting light and a driver driving the semiconductor light emitting device. The communications module may allow the smart engines 2210' and 2310' to communicate with other surrounding devices over communications protocols, such as Wi-Fi, Zigbee®, and Li-Fi.

For example, one smart engine 2210' may be connected to the other smart engine 2310' to communicate therewith. In this case, Wi-Fi extension technology (Wi-Fi mesh) may be applied to mutual communication between the smart engines 2210' and 2310'. At least one smart engine 2210' may be connected to the communications connection device 2100' linked to the communications network 2700' through wired/wireless communications. In order to increase communications efficiency, several smart engines 2210' and 2310' may be grouped into one and connected to a single communications connection device 2100'.

The communications connection device 2100' may be an access point (AP) enabling wired/wireless communication, and may mediate communications between the communications network 2700' and another apparatus. The communications connection device 2100' may be connected to the communications network 2700' by at least one of wired and wireless manners. For example, the communications connection device 2100' may be mechanically accommodated in one of the lighting devices 2200' and 2300'.

The communications connection device 2100' may be connected to the mobile device 2800' through a communications protocol such as Wi-Fi. A user of the mobile device 2800' may receive the environmental information collected by the plurality of smart engines 2210' and 2310' using the communications connection device 2100' connected to the smart engine 2210' of the lighting device 2200'. The environmental information may include nearby traffic information, weather information, or the like. The mobile device 2800' may be connected to the communications network 2700' via the communications base station 2600', using a wireless cellular communications system such as 3G or 4G.

Meanwhile, the server 2400' connected to the communications network 2700' may monitor operating states or the like of the respective lighting fixtures 2200' and 2300' while receiving information collected by the smart engines 2210' and 2310' respectively mounted in the lighting devices 2200' and 2300'. In order to manage the respective lighting devices 2200' and 2300' on the basis of the monitoring results of the operating states of the respective lighting devices 2200' and 2300', the server 2400' may be connected to the computer 2500' providing a management system. The computer 2500' may execute software or the like capable of monitoring and managing operational states of the respective lighting devices 2200' and 2300', particularly the smart engines 2210' and 2310'.

As set forth above, according to the exemplary embodiments described herein, color coordinates of each color source (e.g. red, green, and blue) of a light source module can be effectively tuned by providing, for example, a sub-peak of a second wavelength in addition to a main peak of a first wavelength and increasing or lowering the intensity of the sub-peak.

While exemplary embodiments have been shown and described above, it will be apparent to those skilled in the art that modifications and variations could be made without departing from the scope of the invention as defined by the appended claims.

What is claimed is:
1. A semiconductor device, comprising:
   a first pixel comprising a blue sub-pixel, a green sub-pixel and a red sub-pixel located adjacent to each other,
   the red sub-pixel comprising a first light emitting diode and a first transmissive material layer embedded with a first phosphor on the first light emitting diode to emit first light having a peak intensity at a wavelength of 600 nm or more, the first phosphor configured to convert light generated from the first light emitting diode into red light,
   the green sub-pixel comprising a second light emitting diode and a second transmissive material layer embedded with a second phosphor on the second light emitting diode to emit second light having a peak intensity at a wavelength between 500 nm and 600 nm, the second phosphor configured to convert light generated from the first light emitting diode into first green light, and
   the blue sub-pixel comprising a third light emitting diode and a third transmissive material layer embedded with a third phosphor on the third light emitting diode to emit third light from a surface of the blue sub-pixel, the third phosphor configured to convert light generated from the third light emitting diode into a second green light having a wavelength between 500 nm and 600 nm, and the third light at the surface of the blue sub-pixel having a primary peak intensity of a blue light having a wavelength less than 500 nm and a secondary peak intensity of the second green light, the primary peak intensity of the blue light being greater than the secondary peak intensity of the second green light,
   wherein the first light emitting diode, the second light emitting diode and the third light emitting diode are each configured to generate light having a wavelength less than 500 nm,
   the semiconductor device further comprises a light blocking wall separating the first transmissive material layer, the second transmissive material layer and the third transmissive material layer from each other, and
   the first transmissive material layer, the second transmissive material layer and the third transmissive material layer are disposed to correspond to the first light emitting diode, the second light emitting diode and the third light emitting diode, respectively.
2. The semiconductor device of claim 1,
   wherein the third light emitted by the blue sub-pixel is a spectrum of light having an intensity that varies with respect to wavelength and having the primary peak intensity of blue light and the secondary peak intensity of second green light, wherein an integral of a first graph representing the intensity of the third light with respect to wavelength between first and second local valleys of the first graph on either side of and adjacent to the primary peak intensity equals S1, wherein an integral of the first graph representing the intensity of the third light with respect to wavelength between third and fourth local valleys of the first graph on either side of and adjacent to the secondary peak intensity equals S2, wherein S2 is less than or equal to 20.3% of S1.

3. The semiconductor device of claim 2, wherein the second local valley and the third local valley are the same valley.

4. The semiconductor device of claim 1, wherein a z coordinate of the third light in the CIE 1931 XYZ color space chromaticity diagram is 0.62 or greater.

5. The semiconductor device of claim 1, wherein secondary peak intensity of the second green light of the third light has a wavelength less than 550 nm.

6. The semiconductor device of claim 1,
wherein the peak intensity of the red light of the first light has a wave length of 630 to 780 nm,
wherein the peak intensity of the first green light of the second light has a wavelength of 525 to 580 nm, and
wherein the peak intensity of the blue light of the third light has a wavelength of 440 to 460 nm.

7. The semiconductor device of claim 1, wherein a difference in the wavelengths of the peak intensity of the first green light of the second light and the peak intensity of the second green light of the third light is less than 20 nm.

8. The semiconductor device of claim 1, wherein the wavelengths of the peak intensity of the first green light of the second light and the peak intensity of the second green light of the third light are the same.

9. The semiconductor device of claim 1,
wherein the second phosphor is a first green phosphor, the third phosphor is a second green phosphor, and
wherein the first green phosphor and the second green phosphor are the same phosphor.

10. The semiconductor device of claim 1, wherein the first light emitting diode, the second light emitting diode and the third light emitting diode are identical.

11. The semiconductor device of claim 10, wherein each of the first light emitting diode, the second light emitting diode and the third light emitting diode comprises a first conductivity-type semiconductor layer, a second conductivity-type semiconductor layer and an active layer interposed between the first conductivity-type semiconductor layer and second conductivity-type semiconductor layer, wherein the semiconductor device comprises a wiring electrically connecting the second conductivity-type semiconductor layer of the first light emitting diode, the second light emitting diode and the third light emitting diode in common.

12. The semiconductor device of claim 11, further comprising first, second and third electrode pads each electrically connected to a respective one of the first conductivity-type semiconductor layer of the first light emitting diode, the second light emitting diode and the third light emitting diode, the first, second and third electrode pads not being electrically connected to one another.

13. The semiconductor device of claim 12, wherein the red sub-pixel comprises a transmissive filter layer to selectively block the light generated by the first light emitting diode and to transmit the first light.

14. The semiconductor device of claim 12,
wherein the green sub-pixel comprises a transmissive filter to selectively block the light generated by the second light emitting diode and to transmit the second light, and
wherein the blue sub-pixel does not comprise a transmissive filter.

15. The semiconductor device of claim 1, wherein at least one of the first phosphor, the second phosphor and the third phosphor is formed as a part of a plurality of quantum dots.

16. The semiconductor device of claim 1,
wherein the blue sub-pixel is configured, upon receiving a fixed driving voltage, to emit the third light having the primary peak intensity of the blue light of M watts and the secondary peak intensity of the second green light of N watts,
wherein M and N are real numbers, and
wherein N is greater than 4% but less than 8% of M.

17. The semiconductor device of claim 1, further comprising an insulator electrically isolating the first light emitting diode, the second light emitting diode and the third light emitting diode from each other.

18. The semiconductor device of claim 17, wherein the insulator has a top surface that is substantially co-planar with top surfaces of the first light emitting diode, the second light emitting diode and the third light emitting diode.

19. The semiconductor device of claim 17, wherein the insulator is connected with the light blocking wall.

20. The semiconductor device of claim 1, wherein the first light emitting diode, the second light emitting diode and the third light emitting diode are each configured to generate light having a wavelength in the range of 440 nm to 460 nm.

21. The semiconductor device of claim 1,
wherein the first light emitting diode, the second light emitting diode and the third light emitting diode are each configured to generate ultraviolet light having a wavelength in the range of 380 nm to 440 nm, and
wherein the third transmissive material layer includes a fourth phosphor configured to convert the light generated from the third light emitting diode into blue light having a wavelength less than 500 nm.

* * * * *